US012676640B2

(12) United States Patent
Sivonen et al.

(10) Patent No.: US 12,676,640 B2
(45) Date of Patent: Jul. 7, 2026

(54) MULTIBAND RADIO RECEIVERS

(71) Applicant: Nordic Semiconductor ASA,
Trondheim (NO)

(72) Inventors: Pete Sivonen, Oulu (FI); Jarkko Jussila, Oulu (FI)

(73) Assignee: Nordic Semiconductor ASA,
Trondheim (NO)

( * ) Notice: Subject to any disclaimer, the term of this patent is extended or adjusted under 35 U.S.C. 154(b) by 300 days.

(21) Appl. No.: 18/273,257

(22) PCT Filed: Jan. 24, 2022

(86) PCT No.: PCT/EP2022/051483
§ 371 (c)(1),
(2) Date: Jul. 19, 2023

(87) PCT Pub. No.: WO2022/161911
PCT Pub. Date: Aug. 4, 2022

(65) Prior Publication Data
US 2024/0120959 A1     Apr. 11, 2024

(30) Foreign Application Priority Data

Jan. 26, 2021     (GB) ..................................... 2101010

(51) Int. Cl.
H04B 1/28          (2006.01)
H03D 7/14          (2006.01)
H03D 7/16          (2006.01)

(52) U.S. Cl.
CPC ............. H04B 1/28 (2013.01); H03D 7/1466 (2013.01); H03D 7/165 (2013.01)

(58) Field of Classification Search
CPC .......... H04B 1/28; H04B 1/10; H03D 7/1466; H03D 7/165; H03D 7/1475
See application file for complete search history.

(56) References Cited

U.S. PATENT DOCUMENTS 8,805,309 B2 *  8/2014  Leenaerts .............. H03D 7/165
455/318
10,027,358 B2 *  7/2018  Wu ...................... H04B 1/1036
(Continued)

FOREIGN PATENT DOCUMENTS

CN      107078753 A      8/2017
CN      109347454 A      2/2019
(Continued)

OTHER PUBLICATIONS

Van Liempd et al. "A 0.9V 0.4-6GHz Harmonic Recombination SDR Receiver in 28 nm CMOS With HR3/HR5 and IIP2 Calibration", IEEE Journal of Solid State Circuit, vol. 49, No. 8 (Year: 2014).*

(Continued)

*Primary Examiner* — George Eng
(74) *Attorney, Agent, or Firm* — Klarquist Sparkman, LLP

(57)                    ABSTRACT

A configurable radio frequency receiver is provided. The receiver has at least one low noise amplifier; an oscillator arrangement for producing a plurality of signals having a first number or a second number of separate phases; and multiple mixer modules having inputs connected to an output of the low noise amplifier. The receiver has a configurable resistor network. The receiver is configured such that it can operate in a first mode with said plurality of signals having said first number of phases or a second mode with said plurality of signals having said second number of phases. The configurable resistor network enables the receiver to operate in the first mode in a first configuration, and the second mode in a second configuration. The mixer modules are employed during the operation of the first mode and the second mode.

17 Claims, 19 Drawing Sheets

(56) References Cited

U.S. PATENT DOCUMENTS

| | | | | |
|---|---|---|---|---|
| 11,095,252 | B1 * | 8/2021 | Zhao | H04B 15/005 |
| 2005/0117664 | A1 * | 6/2005 | Adan | H04B 1/408 |
| | | | | 375/316 |
| 2007/0072575 | A1 * | 3/2007 | Sowlati | H03L 7/0992 |
| | | | | 455/318 |
| 2011/0076976 | A1 * | 3/2011 | Ben-Ayun | H04B 1/109 |
| | | | | 455/226.2 |
| 2012/0056644 | A1 | 3/2012 | Kondou | |
| 2013/0051500 | A1 * | 2/2013 | Mo | H03D 7/165 |
| | | | | 375/340 |
| 2018/0048339 | A1 | 2/2018 | Wu et al. | |
| 2020/0274522 | A1 * | 8/2020 | Karmaker | H03F 3/187 |

FOREIGN PATENT DOCUMENTS

| | | |
|---|---|---|
| CN | 111213321 A | 5/2020 |
| JP | 2012-165097 A | 8/2012 |
| WO | WO 2015/169335 A1 | 11/2015 |

OTHER PUBLICATIONS

International Search Report and Written Opinion for PCT/EP2022/051483, mailed May 3, 2022, 16 pages.

IPO Search Report under Section 17(5) for Great Britain Application No. 2101010.3, dated Oct. 25, 2021, 4 pages.

Kaczman et al., "A Single-Chip 10-Band WCDMA/HSDPA 4-Band GSM/EDGE SAW-less CMOS Receiver With DigRF 3G Interface and +90 dBm IIP2," *IEEE Journal of Solid-State Circuits*, vol. 44, No. 3, Mar. 2009, pp. 718-739.

Mirzaei et al., Architectural Evolution of Integrated M-Phase High-Q Bandpass Filters, *IEEE Transactions on Circuits and Systems-1: Regular Papers*, vol. 9, No. 1, Jan. 2012, pp. 52-65.

Ru et al., "Digitally Enhanced Software-Defined Radio Receiver Robust to Out-of-Band Interference," *IEEE Journal of Solid-State Circuits*, vol. 44, No. 12, Dec. 2009, pp. 3359-3375.

Ru, "Frequency Translation Techniques for Interference-Robust Software-Defined Radio Receivers," Dissertation, Nov. 2009, 224 pages.

Van Liempd et al., "A 0.9 V 0.4-6 GHz Harmonic Recombination SDR Receiver in 28 nm CMOS With HR3/HR5 and IIP 2 Calibration," *IEEE Journal of Solid-State Circuits*, vol. 49, No. 8, Aug. 1, 2014, pp. 1815-1826.

Office Action Received for European Application No. 22704735.4 mailed on Jul. 10, 2025, 7 pages.

* cited by examiner

MULTIBAND RADIO RECEIVERS

CROSS REFERENCE TO RELATED APPLICATIONS

This is the U.S. National Stage of International Application No. PCT/EP2022/051483, filed Jan. 24, 2022, which was published in English under PCT Article 21 (2), which in turn claims the benefit of Great Britain Application No. 2101010.3, filed Jan. 26, 2021.

FIELD OF THE INVENTION

The present invention relates to radio receiver architectures for multiband applications.

BACKGROUND

Wireless communication over cellular networks, e.g. LTE or 3G, for a range of internet connected devices e.g. smart phones, tablets, etc., can be made possible by incorporating radio frequency (RF) chipsets into the hardware. There is a growing demand for the RF transceivers of these chipsets to support a large number of frequency bands covering different areas and countries.

For traditional multiband wireless receivers, multiple RF preselection filters and low-noise amplifiers (LNAs) are needed for receiving multiple frequency bands. Typically, an RF preselection filter is used to filter and attenuate harmful out-of-band blocking signals. Blocking signals can drive the receiver into compression, desensitize the receiver and lower the signal-to-noise-ratio (SNR) of the desired received RF signal.

For each frequency band that is supported by a typical multiband receiver, a dedicated RF preselection filter is often included off-chip. External RF preselection filters are typically expensive. As a result most multiband radio receivers end up bulky and costly.

In some frequency-division multiplexing (FDD) radio systems, such as in 3G and 4G cellular systems, the receiver and the transmitter of the same RF transceiver are receiving and transmitting, respectively, simultaneously (full-duplex). Thus, in such FDD RF transceivers, the RF preselection filter is also needed to attenuate the large transmitted signal, which otherwise would leak to the receiver input via common receiver-transmitter antenna. In such cases, the receiver RF preselection filter may also be realized as a duplexer filter, which also includes the transmitter RF filter. In practice, it is very difficult to omit the receiver RF preselection filter in full-duplex FDD systems, since the level of the transmitted RF signal at the antenna can be as large as in the order of +30 dBm.

In contrast to the 3G/LTE full-duplex cellular FDD RF transceivers, in some half-duplex RF transceivers, the receiver and transmitter do not operate simultaneously. As a result, while receiving possibly a very weak RF signal, the receiver does not need to tolerate large RF signals transmitted by the transmitter of the same RF transceiver. For example, in half-duplex LTE radio systems for Internet-of-Things (IoT) applications, it is required that the receiver needs to tolerate at maximum of −15-dBm out-of-band signal at the antenna port while providing sufficiently large SNR for the desired received signal. This blocking signal requirement is so relaxed that it may be possible to design the integrated radio receiver to be sufficiently linear to tolerate the out-of-band blockers without filtering them before they enter to the LNA. If this is the case, it may be possible to omit the RF preselection filters altogether. Here, basically only a single LNA is needed. This leads to lower complexity and bills of material (BOM) compared to the multiband receiver employing a dedicated RF preselection filter for each frequency band.

Besides tolerating the out-of-band blocking signals, the preselection filter-less multiband radio receiver needs to be able to tune to all necessary frequency bands. On the other hand, in multiband radio receivers with a bank of band-dedicated RF filters, each LNA is tuned for reception at the corresponding band.

In RF preselection filter-less direct conversion receivers, down conversion of blocking signals from the harmonics of the frequency ($f_{LO}$) of the local oscillator (LO) signal driving the mixer can be very problematic. Usually, modern receivers employ double-balanced mixers which (ideally) reject down conversion from even order harmonics of $f_{LO}$ while down conversion from odd order harmonics of $f_{LO}$ remain a concern. For this reason, multiband receivers without any preselection filter usually employ a harmonic rejection mixer which rejects blocking signals up to a certain odd order harmonic of $f_{LO}$. In most cases, it is sufficient to use an 8-phase mixer, which rejects down conversion of blocking signals up to $7f_{LO}$ (i.e. the blocking signal at $7f_{LO}$ being the first one which is not rejected).

In receivers with a preselection filter, the down conversion of blocking signals from harmonics of $f_{LO}$ is usually of no concern, since the preselection filter provides sufficient attenuation for the blocking signals at the harmonics of $f_{LO}$. As a result, typically, it is sufficient to employ a 4-phase down conversion mixer in multiband receivers with preselection filtering. As such, 4-phase down conversion itself cannot reject down conversion from odd order harmonics of $f_{LO}$.

Unfortunately, the use of 8-phase mixer requires an LO signal driving the mixer with eight dedicated phases which poses some practical challenges especially at higher operation frequencies. For comparison, the 4-phase mixer needs an LO signal with four dedicated phases which is in practice easier to realize even at higher operation frequencies. Since multiband receivers need in general to be configurable to multiple frequency bands with a wide range of operation frequencies, it is desirable to realize a configurable receiver architecture which can support both modes of operation, e.g. 8-phase and 4-phase. The Applicant has appreciated that one way to achieve this is to implement both circuits in parallel. However, this would cause a large amount of silicon area to be required for many components—e.g. transimpedance amplifiers (TIAs) and mixers. This ultimately leads to a large bill of materials and makes the receiver bulky and costly. The invention aims to mitigate at least some of these problems.

SUMMARY OF INVENTION

According to a first aspect of the present invention there is provided a configurable radio frequency receiver comprising:

at least one low noise amplifier;
  an oscillator arrangement arranged to produce a plurality of signals having a first number or a second number of separate phases;
  a plurality of mixer modules comprising inputs connected to an output of the low noise amplifier, wherein each mixer module comprises a respective mixer and transimpedance amplifier;

two or more output low-pass filters which accept current as their input; and a configurable resistor network comprising a plurality of resistors and switches, the configurable resistor network connecting the plurality of mixer modules to the two or more output low-pass filters, wherein the configurable radio frequency receiver is configured such that it can operate in a first mode with said plurality of signals having said first number of phases or a second mode with said plurality of signals having said second number of phases; and wherein the switches of the configurable resistor network are arranged to configure said resistor network to enable the configurable radio frequency receiver to operate in the first mode in a first configuration, and the second mode in a second configuration, and wherein said plurality of mixer modules are employed during the operation of the first mode and the second mode.

Thus it will be appreciated that the invention provides a configurable dual mode radio frequency (RF) receiver, where the plurality of mixer modules comprising mixers and transimpedance amplifiers TIAs are used during the operation of both the first and second mode. In other words, significant parts of the receiver circuit are shared in both modes. This means that embodiments of the invention may require less silicon area than previous implementations and require fewer components while supporting dual-mode operation, as the mixer modules comprising mixers and transimpedance amplifiers are used for both modes. This may result in lower cost and a reduced bill of materials (BOM) for manufacturing an RF receiver. The skilled person will appreciate that transimpedance amplifiers (TIAs) tend to be bulky components that, in practice, take up a large amount of silicon area. By reducing the number of TIAs on-chip, a significant amount of space on an IC chip can be freed up. Receivers in accordance with the invention may be employed in multiband receivers, with the capability to support both multiband RF preselection filter-less operation and reception at a single frequency band possibly with an RF preselection filter. Therefore, embodiments of the present invention may allow more freedom and flexibility for the design of the RF receiver, voltage control oscillator (VCO), and RF synthesizer.

The configurable RF receiver may comprise an antenna. This antenna may be connected to the LNA.

The configurable RF receiver may be a direct conversion receiver.

In a set of embodiments, the configurable radio frequency receiver comprises one low noise amplifier (LNA). The LNA may be a wideband LNA or a configurable LNA. The LNA may comprise an LC resonator. The LNA may be preceded by a Radio Frequency (RF) preselection filter.

In another set of embodiments, the configurable RF receiver comprises two or more LNAs. In such a set of embodiments the LNAs may be narrowband LNAs and/or wideband LNAs and/or configurable LNAs. The outputs of the LNAs may optionally be connected together. At least one of the LNAs may comprise a resonator—e.g. an inductor-capacitor network, such as an LC tuned circuit. Connecting the outputs of the LNAs together may allow the LNAs to share a common resonator. This would further reduce the amount of silicon area taken up by the receiver circuits on the IC chip. One or more of the LNAs may be preceded by an RF preselection filter. In a set of embodiments a first low noise amplifier of the plurality of low noise amplifiers is not preceded by a preselection filter and a second low noise amplifier of the plurality of low noise amplifiers is preceded by a preselection filter.

The oscillator arrangement will typically comprise a local oscillator (LO) arranged to generate LO signals for feeding to the plurality of mixers. In a set of embodiments, the oscillator arrangement comprises a synthesiser and/or a voltage controlled oscillator for generating LO signals. In a set of embodiments, the oscillator arrangement additionally comprises a first frequency divider for generating the LO signals having the first number of phases, and a second frequency divider for generating the LO signals having the second number of phases. The oscillator arrangement may further comprise NAND gates, and inverters.

In a set of embodiments, a first oscillator signal path comprises the first frequency divider, a first plurality of NAND gates and a first plurality of inverters and a second oscillator signal path comprises the second frequency divider, a second plurality of NAND gates and a second plurality of inverters. When the first mode is enabled the LO signals may be fed through the first oscillator signal path and when the second mode is enabled the LO signals may be fed through the second oscillator signal path. The inverters of each signal path may be enable-inverters, i.e. inverters that can be enabled or disabled depending on which mode is selected. The enable-inverters may be used to establish a state of high impedance at the inverter outputs of the first oscillator signal path when the second mode is selected. Equally, the enable-inverters may be used to establish a state of high impedance at the inverter outputs of the second oscillator signal path when the first mode is selected.

In a set of embodiments, the number of separate phases in the first mode is eight and the number of separate phases in the second mode is four. The mode comprising eight phases may be known as the 8-phase mode. Similarly, the mode comprising four phases may be known as the 4-phase mode.

A mode may be selected based on information relating to the received frequency. For example, the first mode may be selected when the received frequency is below a threshold frequency and the second mode may be selected when the received frequency is above said threshold frequency. In a set of embodiments, the selection of a mode is determined by control software.

Each of the plurality of mixer modules comprises a mixer. In a set of embodiments, the mixers are down-conversion mixers. Each of the plurality of mixers may be current-mode passive mixers. Each mixer may be implemented as a single-balanced mixer or a double-balanced mixer. Each mixer may comprise an LO input. The LO input may be a differential LO input.

In each of the plurality of mixer modules, the respective output(s) of each mixer may be connected to the input(s) of a respective TIA. Those skilled in the art will appreciate that a transimpedance amplifier is a current-to-voltage amplifier. The TIA may comprise a differential amplifier (i.e. having inverting and non-inverting inputs and outputs)—e.g. an op-amp, and may comprise an associated feedback network comprising a TIA feedback resistance and a TIA feedback capacitance. A feedback network may be provided for each of the TIA's outputs, i.e. for the inverting and non-inverting outputs of the TIA, where each feedback network comprises a respective TIA feedback resistor and TIA feedback capacitor between the inverting input and the non-inverting output, and between the non-inverting input and the inverting output.

In a set of embodiments the configurable RF receiver comprises only four mixer modules. In a set of such embodiments, the respective TIA of each module comprises two differential outputs such that the four modules have eight module outputs in total. In a set of embodiments therefore the four mixers are driven by eight signals in total.

In a set of embodiments, the output low-pass filters are transimpedance amplifiers (TIAs). Transimpedance amplifiers are typically first-order low-pass filters that accept current as their input. However, higher-order (e.g. second-order or third-order) low-pass filters may be employed.

The configurable RF receiver may have more than two output low-pass filters, however, in a set of embodiments the configurable RF receiver has only two output low-pass filters (e.g. TIAs). The two output low-pass filters may respectively output in-phase and quadrature signals, i.e. the respective outputs may be 90° out of phase.

The switches of the configurable resistor network may comprise NMOS switch transistors. Equally the switches may comprise PMOS switch transistors or CMOS switches.

In a set of embodiments, in the first mode a first set of switches are closed (enabled) and in the second mode a second set of switches are closed. One or more of the switches may be closed in both modes.

In a set of embodiments, the configurable RF receiver is a half-duplex LTE radio receiver. This may allow the integrated radio receiver to be sufficiently linear to tolerate the out-of-band blockers without filtering them before they enter the LNA. If this is the case, it may be possible to omit the RF preselection filters altogether.

In a set of embodiments, the configurable resistor network is configured such that the voltage gain of the receiver operating in the first mode matches the voltage gain of the receiver operating in the second mode.

In a set of exemplary embodiments, the first mode is an 8-phase mode and the second mode is a 4-phase mode and the configurable resistor network is configured such that the voltage gain when the receiver is in the 4-phase mode matches the voltage gain when the receiver is in the 8-phase mode. For example, the receiver voltage gain is $$A_{V,4-PHA} = \frac{V_{OUT,I}}{V_{IN,RF}} = G_m \frac{\sqrt{2}}{\pi} R_{TIA} \frac{R_{BB}}{R_{BB2}},$$

in the 4-phase mode and $$A_{V,8-PHA} = \frac{V_{OUT,I}}{V_{IN,RF}} = G_m \frac{2}{\pi} \sin\frac{\pi}{8} R_{TIA} 2\sqrt{2} \frac{R_{BB}}{R_{BB1}}$$

in the 8-phase mode. The value of $R_{BB2}$ may be selected as $$R_{BB2} = \frac{R_{BB1}}{4 \sin\frac{\pi}{8}}.$$

This $R_{BB2}$ value equalizes the voltage gains in each mode. Equalized voltage gains may be desirable in order to guarantee that the noise due to the analogue-to-digital converters (ADCs) is suppressed to equal levels in both modes.

Features of any aspect or embodiment described herein may, wherever appropriate, be applied to any other aspect or embodiment described herein. Where reference is made to different embodiments, it should be understood that these are not necessarily distinct but may overlap.

One or more non-limiting examples will now be described, by way of example only, and with reference to the accompanying figures in which:

FIG. 1 schematically shows a direct conversion radio receiver with multiple frequency-band support shown for reference purposes only;

FIG. 2 schematically shows for reference purposes only an RF filter-less receiver;

FIG. 3 schematically shows for reference purposes only a known 4-phase receiver;

FIG. 4A schematically shows for reference purposes only a known 8-phase receiver;

FIG. 4B schematically shows for reference purposes only how an 8-phase receiver rejects down-conversion of $3f_{LO}$ and $5f_{LO}$ blocking signals;

FIG. 5 schematically shows a configurable 8/4-phase receiver according to an embodiment of the present invention;

Figure 9:
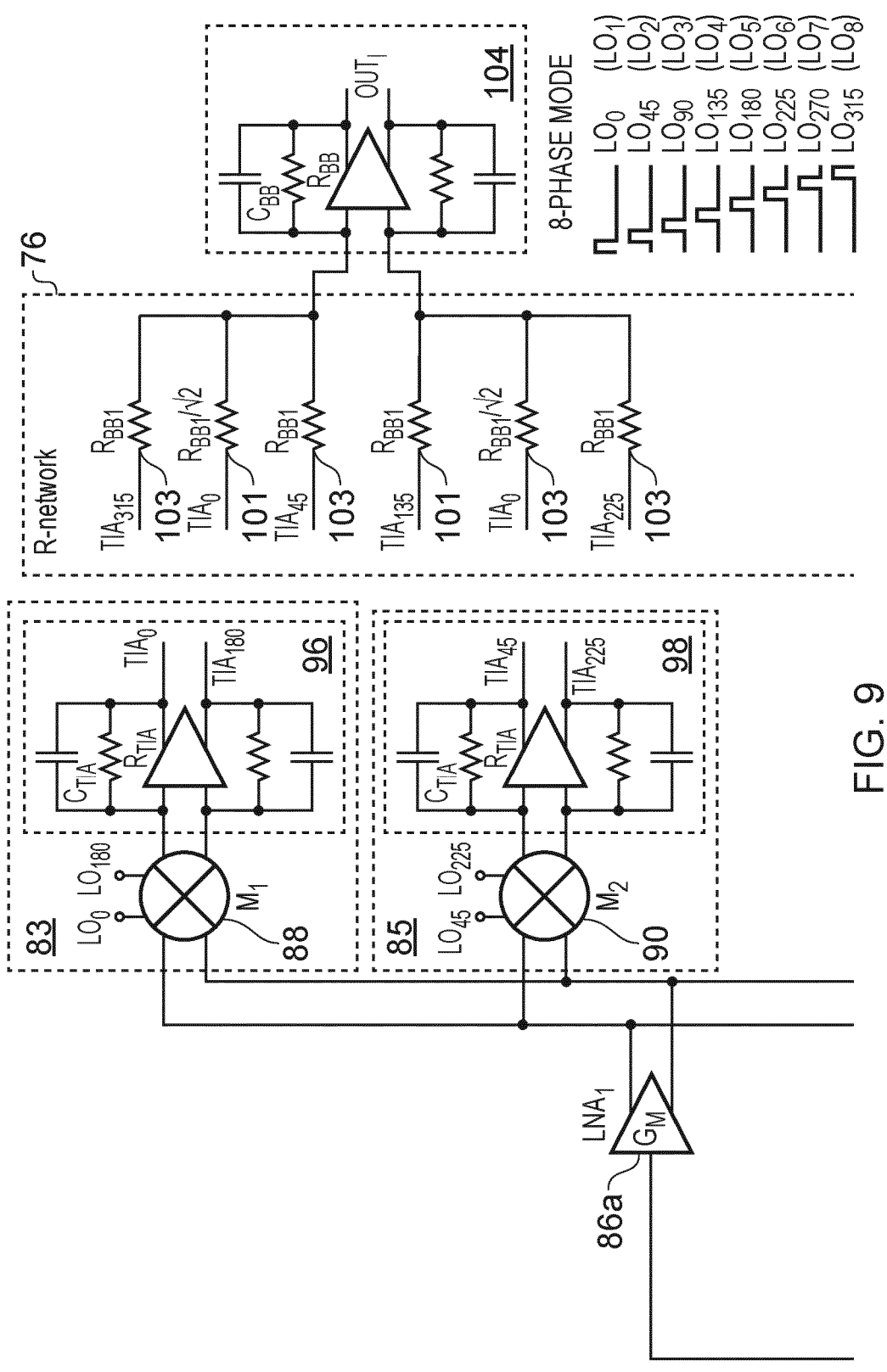
Figure 9:
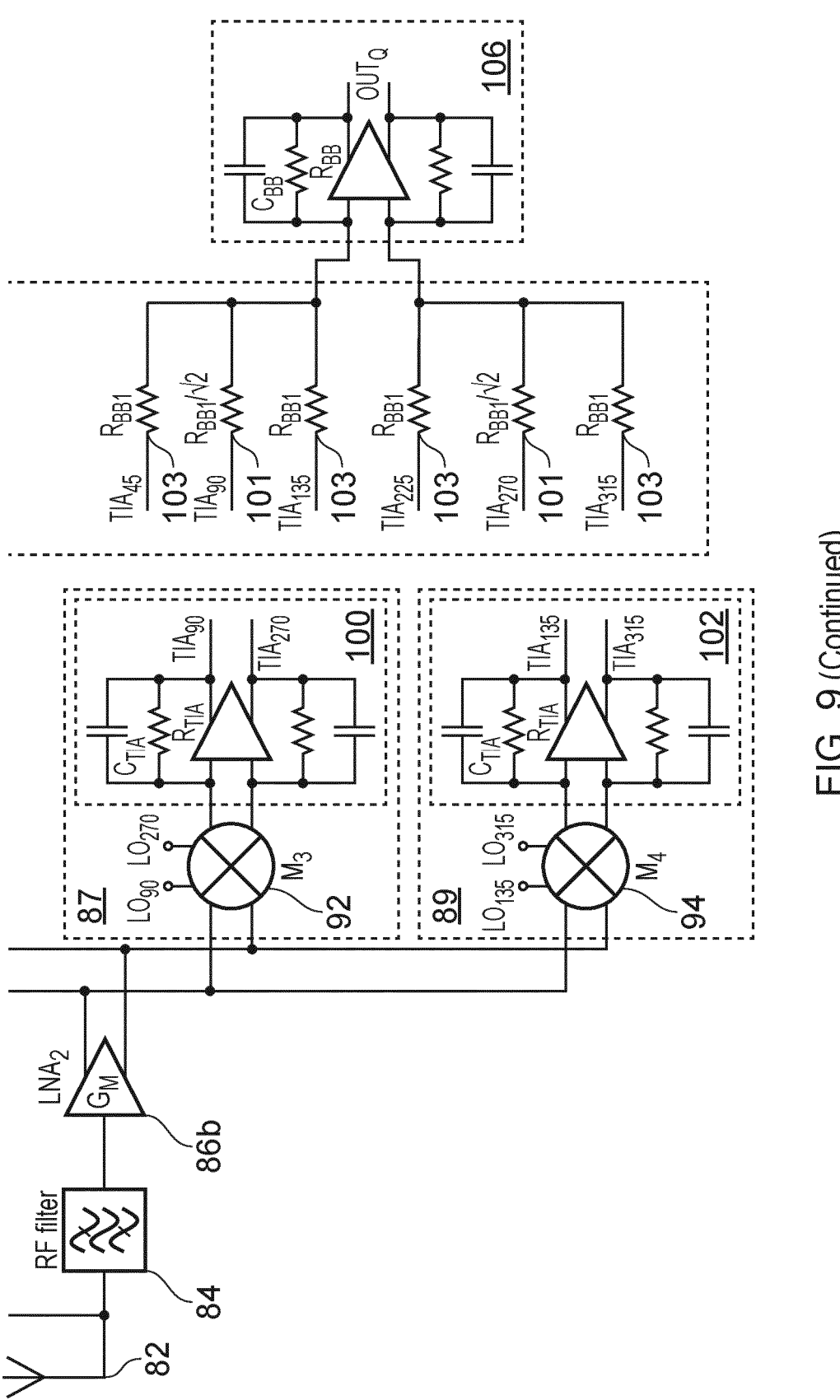
Figure 10:
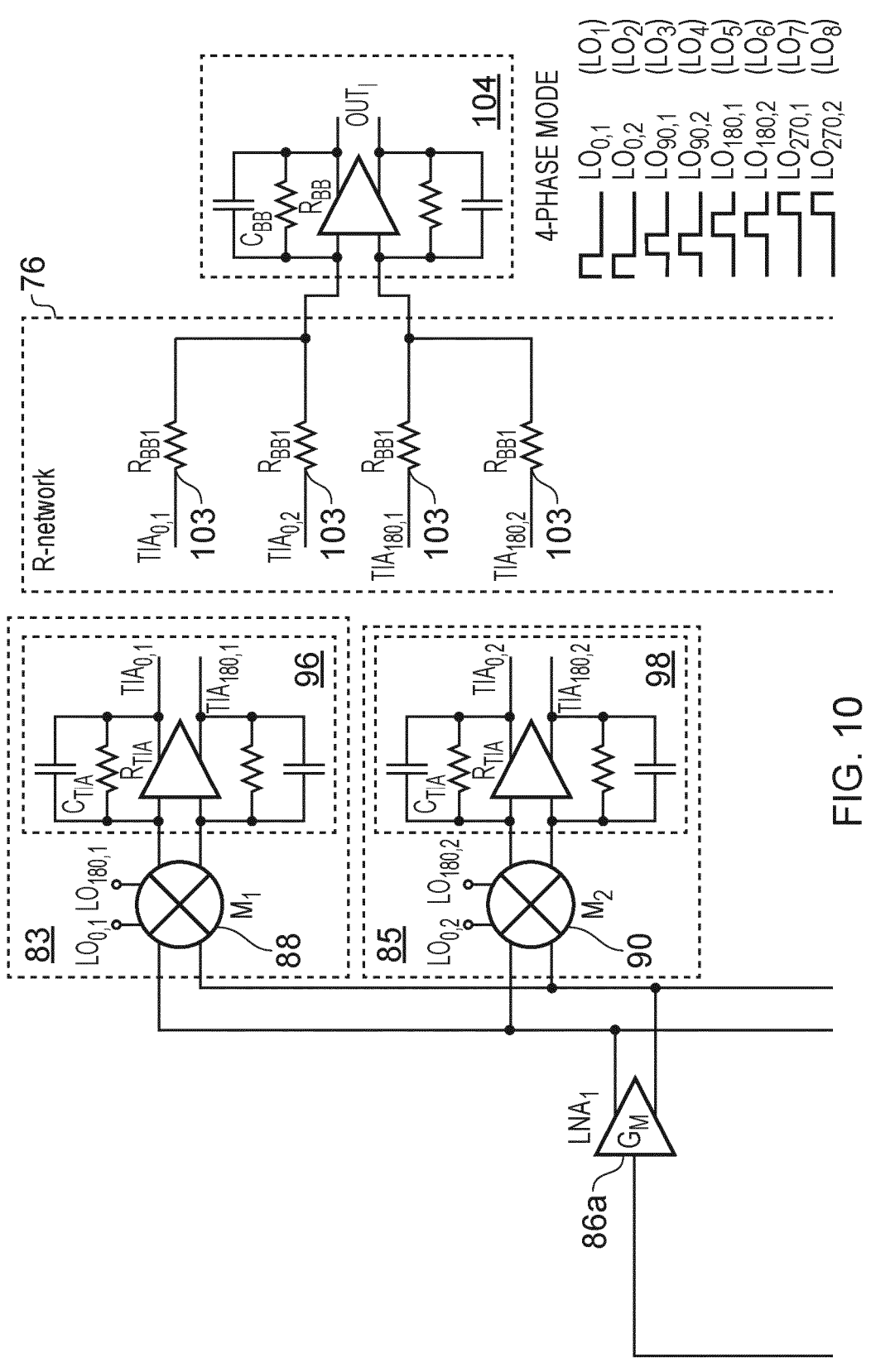
Figure 10:
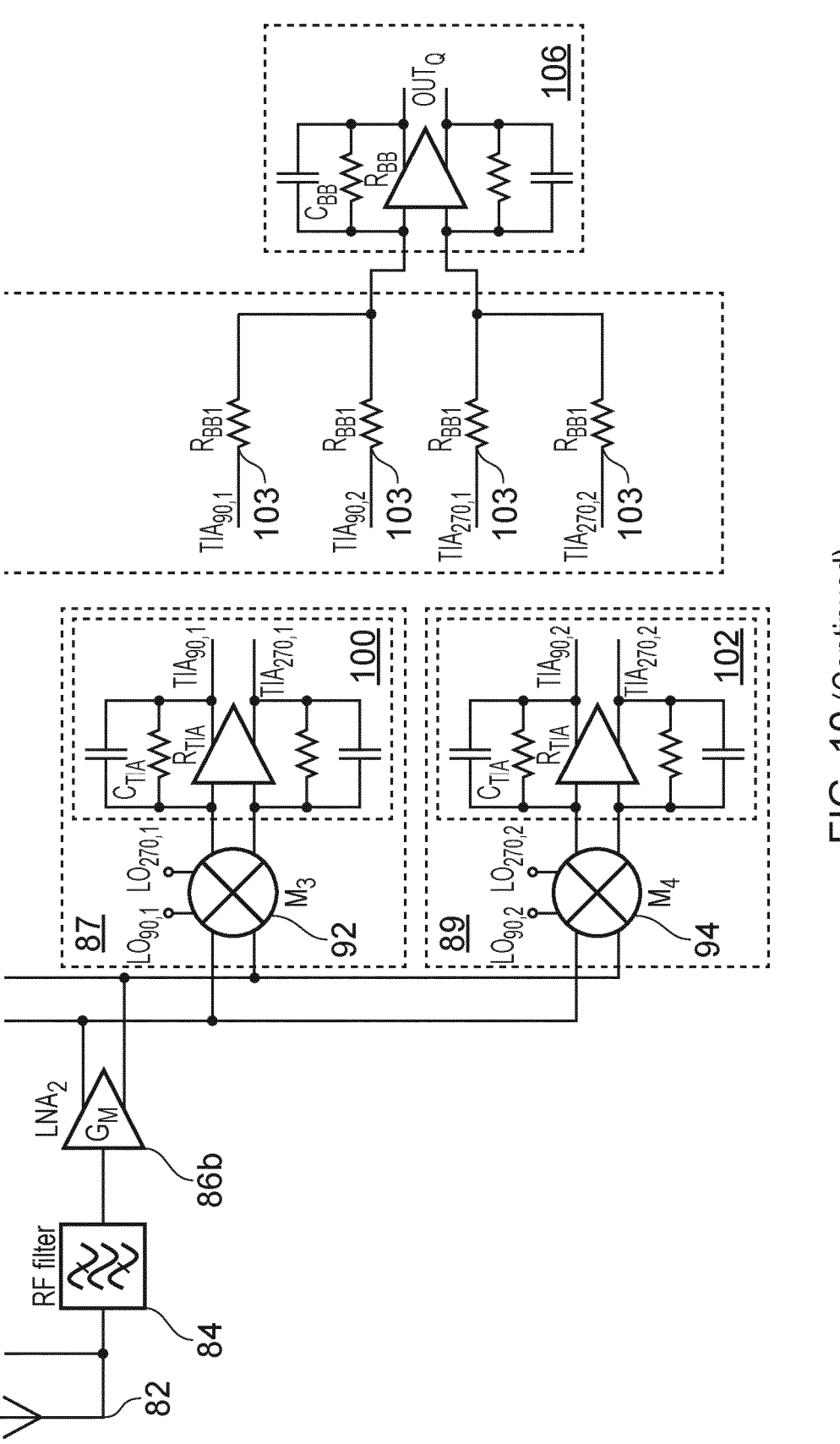

FIG. 9 schematically shows the invention operating in 8-phase mode;

FIG. 10 schematically shows the invention operating in 4-phase mode; and

Figure 11:
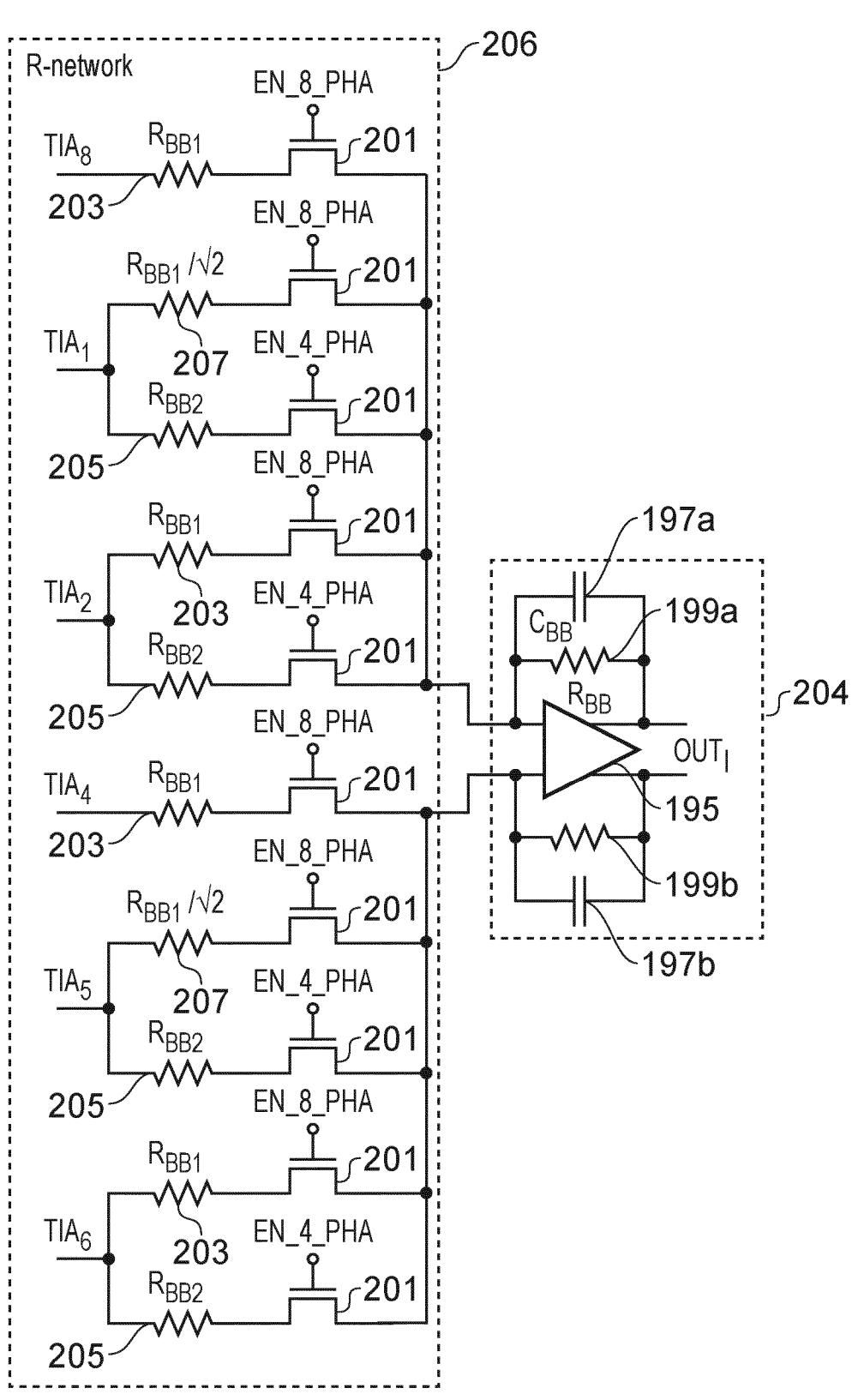

FIG. 11 schematically shows an alternative configurable resistor network for equalizing voltage gains in 8-phase and 4-phase modes.

Figure 1:
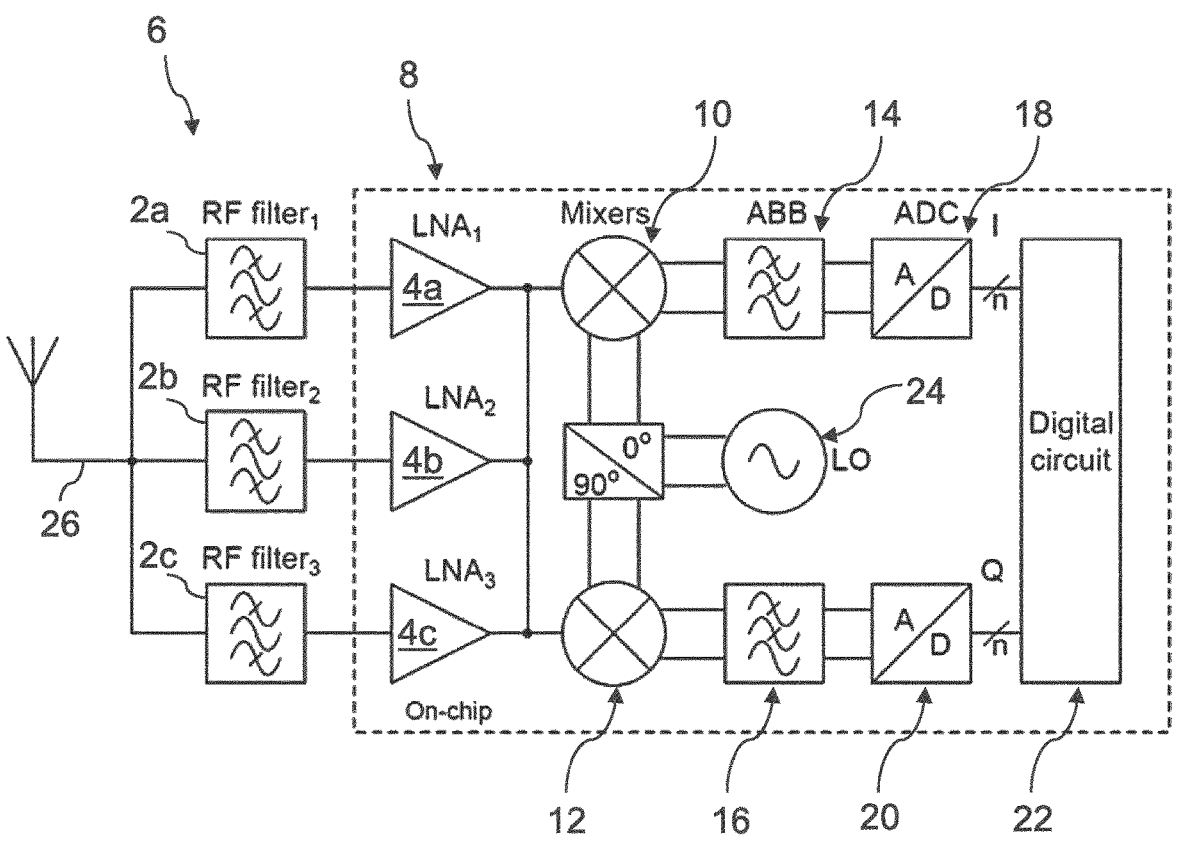

An example of a typical direct conversion radio receiver, which can support reception at three different frequency bands is shown in FIG. 1. In this case, a wireless direct-conversion receiver 6 is arranged to support the reception of three frequency bands using three off-chip RF preselection filters 2a-c connected to an antenna 26. The RF filters 2a-c attenuate out-of-band blocking signals. This direct conversion receiver comprises three LNAs—one for each reception frequency band. The LNAs 4a-c may further attenuate blocking signals (in addition to the attenuation done by the RF preselection filters), e.g. if the LNAs 4a-c employ an LC-resonator circuit. The single activated LNA (4a,b or c) drives down-conversion mixers 10,12. The Local Oscillator (LO) 24 may comprise an on-chip synthesizer with a voltage controlled oscillator (VCO). The frequency dividers generate the I and Q LO signals which drive the mixer LO ports and which have the frequency of $f_{LO}$. The frequency of the LO signal ($f_{LO}$) driving the mixers is tuned to the centre of the receiver signal bandwidth $f_{RX}$. The second mixer 12 is fed an LO signal which is 90° out-of-phase with the first mixer 10. The analogue baseband (ABB) modules 14, 16 further low-pass filter and amplify the signals, which are then converted to a digital signal by the analogue to digital converters (ADCs) 18, 20 to be input to the digital circuit 22.

Usually each frequency band requires its own dedicated RF preselection filter, which also implies that equal amount of LNA inputs are needed on the transceiver integrated circuit (IC).

In general, an RF preselection filter is needed to filter and attenuate harmful out-of-band blocking signals, which can drive the receiver into compression. Blocking signals may also desensitize the receiver and lower the signal-to-noise-ratio (SNR) of the desired received RF signal.

Usually, the RF preselection filters are realized as expensive external off-chip components. In addition, due to the practical implementation and technical reasons, for each frequency reception band, a dedicated RF filter is needed. As a result, the realization of multiband radio receiver shown in FIG. 1 becomes bulky and expensive.

As the direct conversion RF receiver 6 of FIG. 1 has a dedicated off-chip RF preselection filter 2a-c and a dedicated on-chip LNA 4a-c for each of the reception frequency bands, it is relatively bulky and expensive.

In some frequency-division multiplexing (FDD) radio systems, such as in 3G and 4G cellular systems, the receiver and the transmitter of the same RF transceiver are receiving and transmitting, respectively, simultaneously (full-duplex). Thus, in such FDD RF transceiver, the RF preselection filter is also needed to attenuate the large transmitted signal, which otherwise would leak to the receiver input via common receiver-transmitter antenna. In such cases, the receiver RF preselection filter may also be realized as a duplexer filter, which also includes the transmitter RF filter. In practice, it is very difficult to omit the receiver RF preselection filter in full-duplex FDD systems, since the level of the transmitted RF signal at the antenna can be as large as in the order of +30 dBm.

In contrast to the 3G/LTE full-duplex cellular FDD RF transceivers, in some half-duplex RF transceivers, the receiver and transmitter do not operate simultaneously. As a result, while receiving possibly a very weak RF signal, the receiver does not need to tolerate large RF signal transmitted by the transmitter of the same RF transceiver. For example, in half-duplex LTE radio systems for Internet-of-Things (IoT) applications, it is required that the receiver needs to tolerate at maximum of −15-dBm out-of-band signal at the antenna port while providing sufficiently large SNR for the desired received signal. This blocking signal requirement is so relaxed that it may be possible to design the integrated radio receiver to be sufficiently linear to tolerate the out-of-band blockers without filtering them before they enter to the LNA. If this is the case, it may be possible to omit the RF preselection filters altogether. This results in the multiband radio receiver shown in FIG. 2 in which basically only a single LNA is needed. This leads to lower complexity and bills of material (BOM) compared to the multiband receiver shown in FIG. 1.

Figure 2:
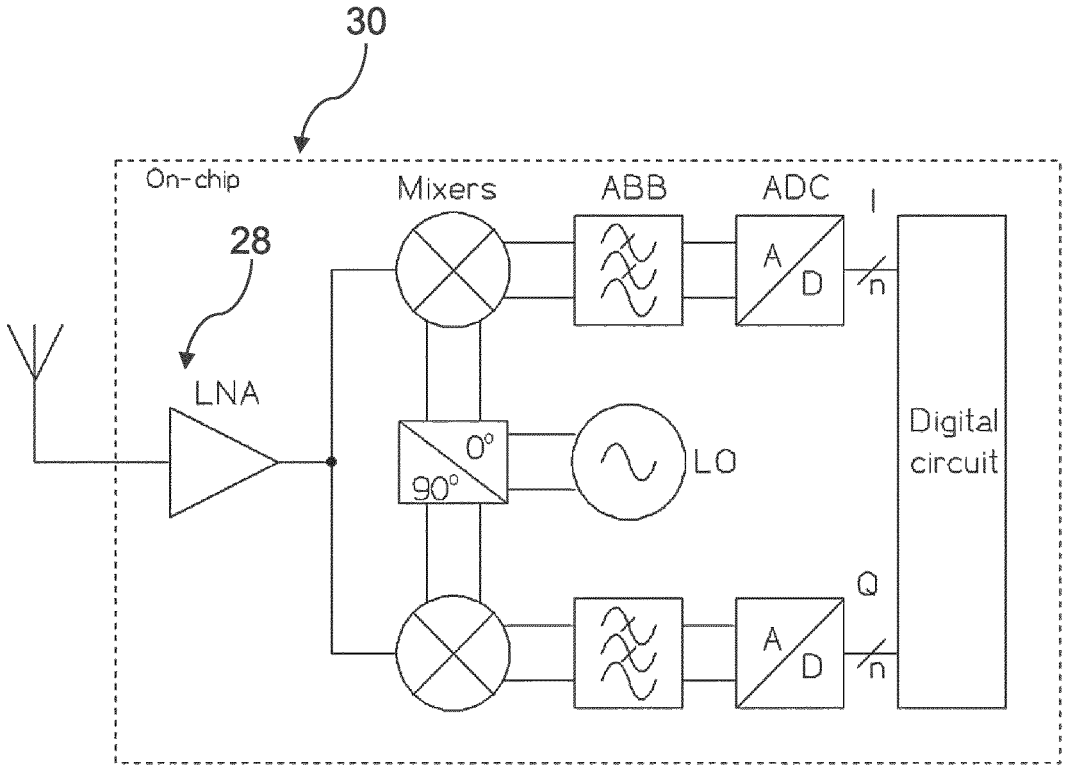

A multiband wireless receiver without any RF preselection filters is shown in FIG. 2. The receiver 30 comprises a single LNA 28 in place of the three RF filters 2a-c and three LNAs 4a-c of FIG. 1.

Besides tolerating the out-of-band blocking signals, the multiband radio receiver shown in FIG. 2 needs to be able to tune to all necessary frequency bands. On the other hand, in multiband radio receiver with a bank of band-dedicated RF filters (FIG. 1), each LNA is tuned for reception at the corresponding band.

The down-conversion mixers, e.g. 10, 12, shown in FIGS. 1 and 2 are typically single- or double-balanced circuits where the local oscillator (LO) signal at the mixer LO input resembles a square wave toggling at the LO frequency ($f_{LO}$). Such a square wave has desired spectral component at $f_{LO}$ but also components at the harmonics of $f_{LO}$ ($2f_{LO}$, $3f_{LO}$, etc.). In a single-balanced or a double-balanced mixer, a differential LO drive is used and even order LO harmonics are ideally all suppressed and they cause no concern.

In direct conversion receivers, the frequency of the LO signal ($f_{LO}$) feeding into the down-conversion mixer is tuned to the center of the receiver signal bandwidth such that $f_{LO}=f_{RX}$. In other words, the down-conversion mixer down-converts the desired signal (or channel) at $f_{RX}$ to 0 Hz (DC) and it is then further processed (filtered and amplified) by the analogue baseband (ABB) module before being converted to a digital signal by the analogue-to-digital converter (ADC).

In practice, the blocking signals situated at the harmonic frequencies of the desired RF signal frequency may prove to be very problematic. Harmonic frequency blockers are situated at frequencies $f_{BL,H}$, which relate to the desired RF signal frequency ($f_{RX}$) in the following way:

$f_{BL,H}=nf_{RX}=nf_{LO}$ where, n=2, 3 . . .

As well as down-converting the desired RF signal at $f_{RX}$ ($f_{LO}$) to DC, the LO harmonics may down-convert the possible blocking signals presented at the mixer RF input at $f_{BL,H}$ to DC which may severely degrade the quality of the desired down-converted signal. As discussed, with differential LO drive, usually only the odd order LO harmonics are concern, since the blocking signals at the even-order LO harmonics are rejected in a balanced mixer.

For the receiver depicted in FIG. 1, the blocking signals at the harmonics of $f_{LO}$ are situated at the filter 2a-c stopband and they are attenuated before they enter the LNAs 4a-c. Depending on the LNA implementation, the blocking signals at $f_{BL,H}$ may also experience attenuation in the LNA before they enter the mixer RF input and are down-converted by the mixer. For example, if the LNA employs an LC-resonator circuit at its load, the LNA will provide some attenuation for the blocking signals at $nf_{RX}$ compared to the desired RF signal at $f_{RX}$.

Unfortunately, in a radio receiver without a RF preselection filter (FIG. 2), there is no RF filter to provide attenuation for the blocking signals at $f_{BL,H}$ before they travel to the LNA 28. Thus, after possibly being attenuated only in the LNA 28, they enter the mixer and, after down-conversion by the LO harmonics, they appear at DC. As a result, a blocking signal appearing at the harmonic frequency of the desired RF signal frequency can severely degrade the SNR of the desired RF signal. The SNR can be degraded because of the down-conversion of the blocker at $f_{BL,H}$ even if the receiver 30 was not compressed by the blocking signal at $f_{BL,H}$.

Two types of multiband receivers have been discussed. The typical multiband receiver of FIG. 1 is made bulky and expensive by each frequency band requiring a dedicated off-chip pre-selection filter and on-chip LNA. Whereas the RF preselection filter-less receiver of FIG. 2 can be prone to harmonic blockers which can severely degrade the signal-to-noise-ratio (SNR) of the desired received RF signal.

A way of dealing with the harmful down-conversion of blocking signals is to employ a direct conversion receiver having mixers which are driven by LO signals having a suitable number of separate phases. M-phase direct conversion receivers typically comprise down-conversion mixers which are driven by LO signals having M separate phases. For example, a 4-phase receiver may comprise mixers which are driven by LO signals having four separate phases (90°, 180°, 270°, 360°) and similarly an 8-phase receiver may comprise mixers which are driven by LO signals having eight separate phases (0°, 45°, 90°, 135°, 180°, 225°, 270°, 315°). As will be explained below, an M-phase down-conversion mixer can reject harmful down-conversion of blocking signals up to (but not including) the $(M-1)^{th}$ harmonic of the LO signal.

Figure 3:
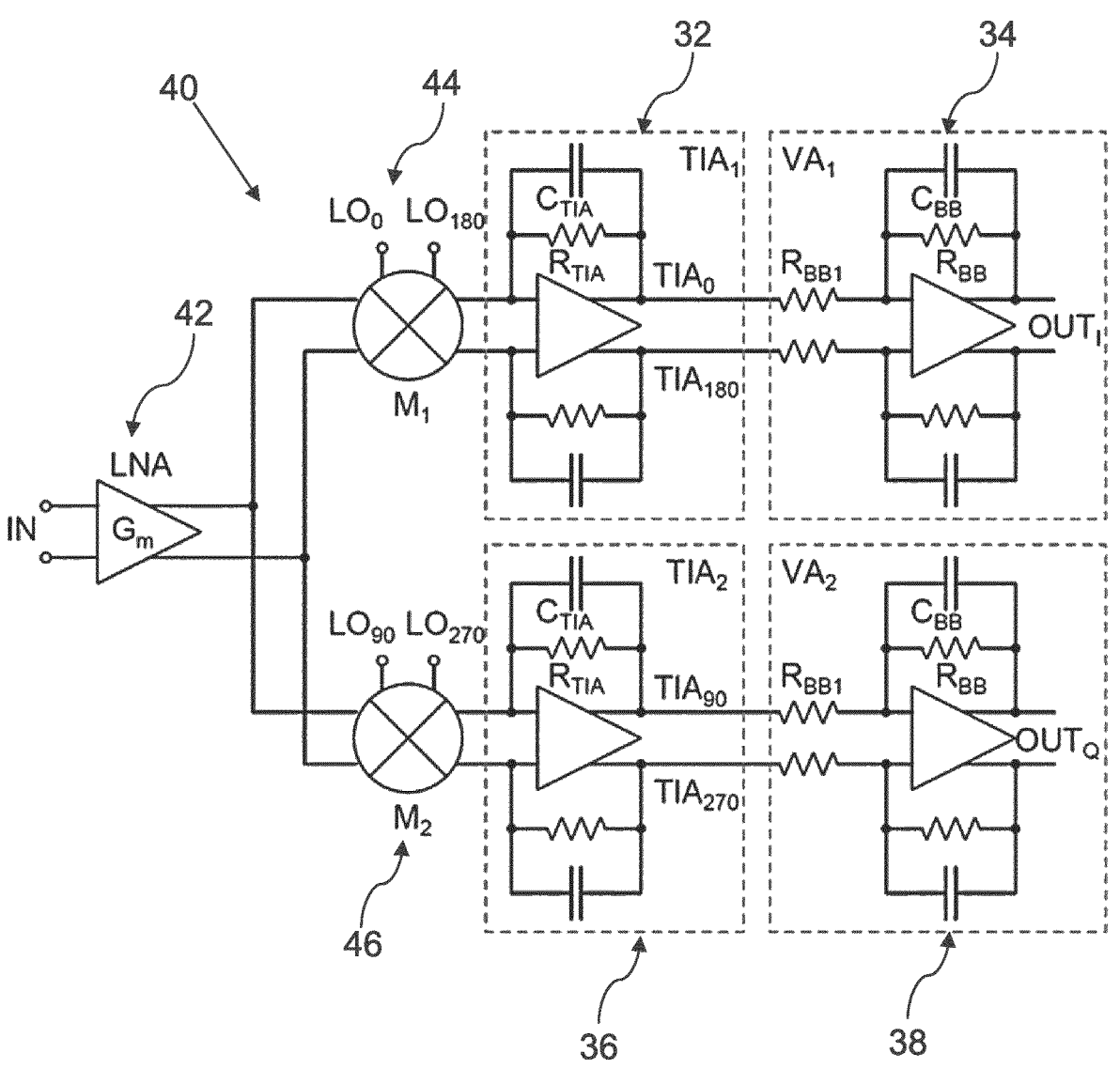

An example of a traditional direct conversion receiver (4-phase wireless receiver) is shown in FIG. 3. The receiver is called a 4-phase receiver as the down conversion mixer is essentially driven by an LO signal having four separate phases (0°, 90°, 180°, and 270°). The 0° and 90° signals can also be called as in-phase (I) and quadrature-phase (Q) signals, respectively.

The antenna, which would be connected to the input of the LNA, is omitted for simplicity. Typical 4-phase receivers cannot effectively reject LO harmonic frequencies, so an RF pre-selection filter (not pictured) may be used by the 4-phase receiver 40 to attenuate out-of-band blocking signals. In this example, the 4-phase receiver 40 has one LNA 42, which can be modelled as a transconductance ($G_m$) amplifier; two current-mode mixers 44, 46, each with a differential RF input, LO input and a differential output; two transimpedance amplifiers (TIAs) 32, 36 and two voltage amplifiers (VAs) 34, 38. Mixers 44, 46 are driven by I/Q LO signals and differential LO signals are provided to each mixer 44, 46 (the LO signals have four separate phases in total). Each mixer 44, 46 is followed by a respective TIA 32, 36 and VA 34, 38.

The operation of a 4-phase receiver will now be explained in more detail with reference to FIG. 3.

The LNA 42, converts the incoming RF input voltage ($v_{IN,RF}$) to an output RF current, which is fed to the current-mode passive mixers $M_1$ and $M_2$. In this example, a balanced LNA with differential inputs and outputs is shown. The current-mode mixers 44, 46 are driven by an LO signal having duty cycle of ¼ or 25% (see FIG. 8C). The current-mode mixer e.g. 44 commutates the incoming RF current and it translates it to a baseband (BB) output current, which is driven to the feedback loop of the transimpedance amplifier (TIA)—e.g. 32. The TIA 32 converts the mixer BB output current to a BB voltage with low-pass filtering. The TIA 32 is followed by an additional voltage amplifier (VA) 34, which provides additional amplification and filtering. FIG. 3 is only illustrative and actual realization of a direct conversion receiver is more complicated. For example, the BB stage following the TIAs usually consists of higher order, for example second-order, low-pass filtering. Also, the ADCs are not shown.

In FIG. 3 the current-mode passive mixer, e.g. 44, operates by multiplying the incoming RF signal current by a pulse train 1,0,-1,0 describing the differential 25% duty cycle LO waveform. This results in the following mixer $M_1$ 44 output current:

$$i_{OUT,M_1}(t) = G_m v_{IN,RF}(t) \frac{2\sqrt{2}}{\pi} \left( \cos\omega_{LO}t + \frac{1}{3}\cos3\omega_{LO}t - \frac{1}{5}\cos5\omega_{LO}t + \dots \right)$$

The desired RF signal appears at the LNA 42 input at $\omega_{RF}=(\omega_{LO}+\omega_{BB})$ where $f_{BB}$ is the frequency of the low-frequency BB signal ($\omega_{BB}=2\pi f_{BB}$):

$$v_{IN,RF}(t)=V_{IN,RF} \cos \omega_{RF}t = V_{IN,RF} \cos(\omega_{LO}+\omega_{BB})t$$

The mixer output current displays components at multiple frequencies, but after the low-pass filtering by the TIA, the TIA$_1$ 32 differential output voltage appears as:

$$v_{TIA_1,LO}(t) = G_m V_{IN,RF} \frac{\sqrt{2}}{\pi} R_{TIA}\cos\omega_{BB}t = V_{BB}\cos\omega_{BB}t \qquad (1)$$

where:

$$V_{BB} = G_m \frac{2}{\pi} R_{TIA} V_{IN,RF}.$$

Here, $\sqrt{2}/\pi$ represents the conversion loss due to the mixing by the 25% duty cycle LO signal and $R_{TIA}$ is the TIA feedback resistance. The subscript LO refers to the down-conversion from $f_{LO}$.

If a blocking signal appears at the LNA input at $(3\omega_{LO}+\omega_{BB})$, the third-order harmonic of the LO signal down-converts the blocker on top of the desired signal. Accordingly, the down-converted blocking signal level at the TIA$_1$ output is:

$$v_{TIA_1,3LO}(t) = G_m V_{IN,RF} \frac{\sqrt{2}}{\pi} R_{TIA}\frac{1}{3}\cos\omega_{BB}t = \frac{V_{BB}}{3}\cos\omega_{BB}t \qquad (2)$$

Similarly, if a blocking signal appears at the LNA input at $(5\omega_{LO}+\omega_{BB})$, the fifth-order harmonic of the LO signal down-converts the blocker to $f_{BB}$ and the corresponding down-converted blocking signal level at the TIA$_1$ output is:

$$v_{TIA_1,5LO}(t) = -G_m V_{IN,RF} \frac{\sqrt{2}}{\pi} R_{TIA}\frac{1}{5}\cos\omega_{BB}t = -\frac{V_{BB}}{5}\cos\omega_{BB}t \qquad (3)$$

In the above two equations, the subscripts 3LO and 5LO refer to the down-conversion from $3f_{LO}$ and $5f_{LO}$, respectively.

The above voltages (1), (2), and (3) at the TIA output are sinusoidal signals at $f_{BB}$. Thus, these signals can be also expressed with their amplitude and phase angle, i.e. as rotating phasors. By using a phasor notation, the desired down converted signal at the TIA$_1$ output is given as $$V_{TIA_1,LO}=V_{BB}\angle 0°$$

Similarly, for given RF input voltage amplitude at the LNA input, the corresponding down-converted blocking signals from $3f_{LO}$ and $5f_{LO}$ can be expressed at the TIA$_1$ output as $$V_{TIA_1,3LO} = \frac{V_{BB}}{3}\angle 0°$$

$$V_{TIA_1,5LO} = \frac{V_{BB}}{5}\angle 180°$$

It is seen that for given RF input voltage amplitude $V_{IN,RF}$, the levels of the down-converted blocking signals from $3f_{LO}$ and $5f_{LO}$ appearing at the TIA output are only by $$\frac{1}{3}(-9.5 \text{ dB}) \text{ and } \frac{1}{5}(-14 \text{ dB}),$$

respectively, lower than the level of the desired signal. In practice, the LNA might employ LC tuned circuits at its input and output for input matching and peaking the gain, respectively, and such LC circuits will provide additional attenuation for the possible blocking signals at $3f_{LO}$ and $5f_{LO}$. In addition, by employing the RF preselection filter, e.g. 84, the blockers at $3f_{LO}$ and $5f_{LO}$ can usually be attenuated to a level at which they cause no concern.

In the RF preselection filter-less receiver, the LNA needs to usually tune to a wide band of frequencies and the narrowband LC input matching circuit cannot be used. Accordingly, the attenuation provided by the input matching circuit and the RF preselection filter itself for the blocking signals at $3f_{LO}$ and $5f_{LO}$ is not available. Instead, additional techniques are usually needed to reject down conversion of blocking signals from $3f_{LO}$ and $5f_{LO}$. Usually, the blocking signals at the higher order LO harmonics, i.e. at $7f_{LO}$ and above, are less of concern.

Taking into account the voltage gain of the $VA_1$, the desired I-channel output voltage is given as:

$$V_{OUT,I} = \frac{R_{BB}}{R_{BB1}} V_{BB} \angle 0°.$$

Similarly, the Q-channel output voltage is:

$$V_{OUT,Q} = \frac{R_{BB}}{R_{BB1}} V_{BB} \angle 90°.$$

From $$V_{OUT,I} = \frac{R_{BB}}{R_{BB1}} V_{BB} \angle 0°,$$

the voltage conversion gain from the LNA input to the I-channel (or Q-channel) output for the 4-phase receiver is:

$$A_V = \frac{V_{OUT,I}}{V_{IN,RF}} = G_m \frac{\sqrt{2}}{\pi} R_{TIA} \frac{R_{BB}}{R_{BB1}}.$$

Figure 4A:
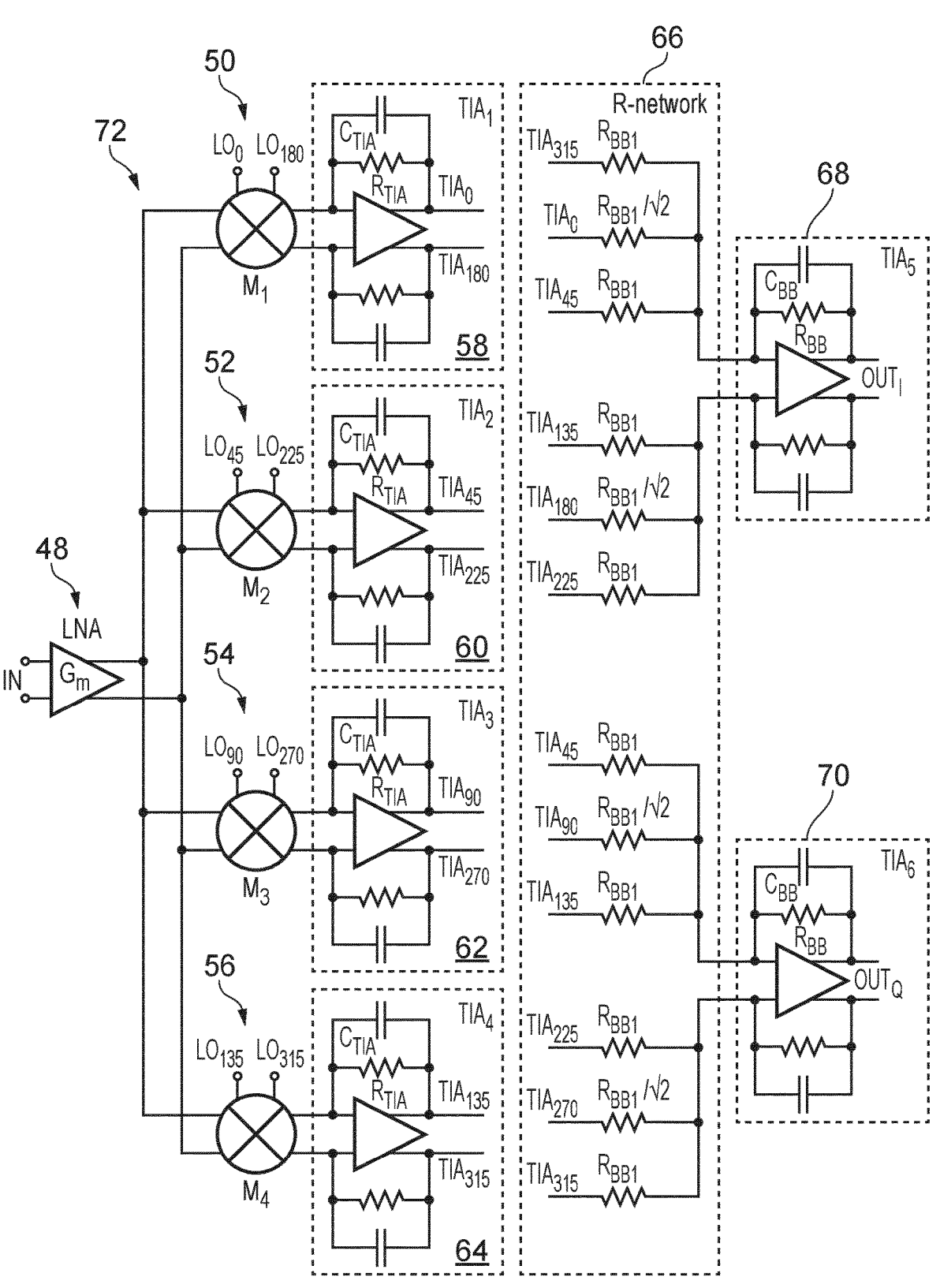

A direct conversion receiver employing an 8-phase harmonic rejection mixer, is shown, by way of background in FIG. 4A (antenna and possible RF pre-selection filter not shown). This receiver may be known as an 8-phase receiver, where the down conversion mixer is driven by an LO signal having eight separate phases (0°, 45°, 90°, 135°, 180°, 225°, 270°, and 315°). The 8-phase receiver 72, as shown in FIG. 4A, also has a single LNA 48 in this particular example, (again can be modelled as a transconductance ($G_m$) amplifier). However, here the differential outputs of the LNA 48 are connected to four mixers 50, 52, 54, 56; followed by four respective TIAs 58, 60, 62, 64; which are followed by a resistor network 66 connecting the outputs of the four TIAs 58, 60, 62, 64 to the inputs of two 'output' low-pass filters that can accept current as their input, embodied as two 'output' TIAs 68, 70 that produce the desired I-Q signals. The resistances in the resistor network are weighted at each of the inputs of the output TIAs with a $1:1/\sqrt{2}:1$ ratio.

As the 8-phase receiver 72 is able to reject blocking signals at $3f_{LO}$ and $5f_{LO}$, it is better suited for RF preselection filter-less receiver architecture compared to the 4-phase receiver, in which blocking signals at $3f_{LO}$ and $5f_{LO}$ are down-converted to DC. However, due some practical technical reasons (as will be discussed in detail in the following), there are some challenges in the implementation of 8-phase receiver at high operation frequencies that are less problematic with 4-phase receivers.

The detailed operation of a typical 8-phase receiver 72 will be explained with reference to FIG. 4A.

The LNA 48 of the 8-phase receiver 72 converts the incoming RF input voltage ($v_{IN,RF}$) to an output RF current, which is input to the down-conversion mixers, which in this example are current-mode passive mixers 50, 52, 54, 56 ($M_1$-$M_4$). Here, the current-mode mixers 50, 52, 54, 56 are driven by an LO signal having duty cycle of ⅛ or 12.5% (see FIG. 7C). After the mixers translate the RF current to the baseband (BB) current, the four TIAs 58, 60, 62, 64 (TIA$_1$-TIA$_4$) convert the BB current to the BB voltage with low-pass filtering. At the outputs of each of the four TIAs 58, 60, 62, 64 (TIA$_1$-TIA$_4$), the BB output voltage has equal magnitude but dedicated phase.

In this case, the current-mode passive mixer operates by multiplying the incoming RF signal current by a pulse train 1,0,-1,0 describing the differential 12.5% duty cycle LO waveform. This results in a mixer, e.g. 50 ($M_1$), output current of:

$$i_{OUT,M_1}(t) =$$
$$G_m v_{IN,RF}(t) \frac{4}{\pi} \left( \sin\frac{\pi}{8} \cos\omega_{LO}t + \frac{1}{3}\sin\frac{3\pi}{8}\cos3\omega_{LO}t + \frac{1}{5}\sin\frac{5\pi}{8}\cos5\omega_{LO}t + \dots \right)$$

The desired RF signal appears at the LNA 48 input at $\omega_{RF}=(\omega_{LO}+\omega_{BB})$ [recalling $v_{IN,RF}(t)=V_{IN,RF} \cos \omega_{RF}t = V_{IN,RF} \cos(\omega_{LO}+\omega_{BB})t$]. After the low-pass filtering by the TIA, e.g. TIA$_1$ 58, the TIA$_1$ differential output voltage appears as:

$$v_{TIA_1,LO}(t) = G_m V_{IN,RF} \frac{2}{\pi} \sin\frac{\pi}{8} R_{TIA}\cos\omega_{BB}t = V_{BB,LO}\cos\omega_{BB}t$$

where in this case:

$$V_{BB,LO} = G_m \frac{2}{\pi}\sin\frac{\pi}{8}R_{TIA}V_{IN,RF}$$

Here, $$\left( \frac{2}{\pi}\sin\frac{\pi}{8} \right)$$

represents the conversion loss due to the mixing by the 12.5% duty cycle LO signal. The subscript LO refers to the down-conversion of the desired RF signal from $f_{LO}$.

Using phasor notation, the desired down-converted signal at the TIA$_1$ output is given as:

$$V_{TIA_1,LO}=V_{BB,LO}\angle 0°$$

Similarly, it can be shown that the corresponding down-converted blocking signals from $3f_{LO}$ and $5f_{LO}$ can be expressed at the TIA$_1$ output as:

$$V_{TIA_1,3LO}=_{BB,3LO}\angle 0°$$

$$V_{TIA_1,5LO}=_{BB,5LO}\angle 0°$$

where:

$$V_{BB,3LO} = G_m \frac{2}{3\pi}\sin\frac{3\pi}{8}R_{TIA}V_{IN,3RF}$$

$$V_{BB,5LO} = G_m \frac{2}{5\pi}\sin\frac{5\pi}{8}R_{TIA}V_{IN,5RF}$$

The subscripts $3_{RF}$ and $5_{RF}$ simply mean, that the amplitudes of the blocking signals at the LNA input at $3f_{LO}$ ($3f_{RF}$) and $5f_{LO}$ ($5f_{RF}$) are usually different from each other and from the amplitude of the desired signal.

In the same way, at the output of $TIA_2$ 60, the down-converted desired and blocking signals from $3f_{LO}$ and $5f_{LO}$ can expressed as:

$$V_{TIA_2,LO} = V_{BB,LO} \angle 45°$$

$$V_{TIA_2,3LO} = V_{BB,3LO} \angle 135°$$

$$V_{TIA_2,5LO} = V_{BB,5LO} \angle 225°$$

In addition, at the output of $TIA_3$ 62, the down-converted desired and blocking signals from $3f_{LO}$ and $5f_{LO}$ are:

$$V_{TIA_3,LO} = V_{BB,LO} \angle 90°$$

$$V_{TIA_3,3LO} = V_{BB,3LO} \angle 270°$$

$$V_{TIA_3,5LO} = V_{BB,5LO} \angle 90°$$

Finally, at the $TIA_4$ 64 output, the down-converted desired and blocking signals from $3f_{LO}$ and $5f_{LO}$ are:

$$V_{TIA_4,LO} = V_{BB,LO} \angle 270°$$

$$V_{TIA_4,3LO} = V_{BB,3LO} \angle 45°$$

$$V_{TIA_4,5LO} = V_{BB,5LO} \angle 270°$$

In order to construct the desired I and Q signals and to reject down-converted blocking signals from $3f_{LO}$ and $5f_{LO}$, the four TIA BB output voltages need to be summed and weighted properly. Summing currents is more straightforward than summing voltages directly, therefore, the TIA output voltages are first converted to currents by the resistor network (R-network) 66 of FIG. 4A and then summed at the inputs of the $TIA_5$ 68 and $TIA_6$ 70. The sum of currents is converted back to voltages by the $TIA_5$ 68 and $TIA_6$ 70 with additional low-pass filtering.

Unlike 4-phase receivers, 8-phase receivers might not require RF preselection filters to be effective at rejecting undesirable harmonic blockers at $3f_{LO}$ and $5f_{LO}$.

Figure 4B:
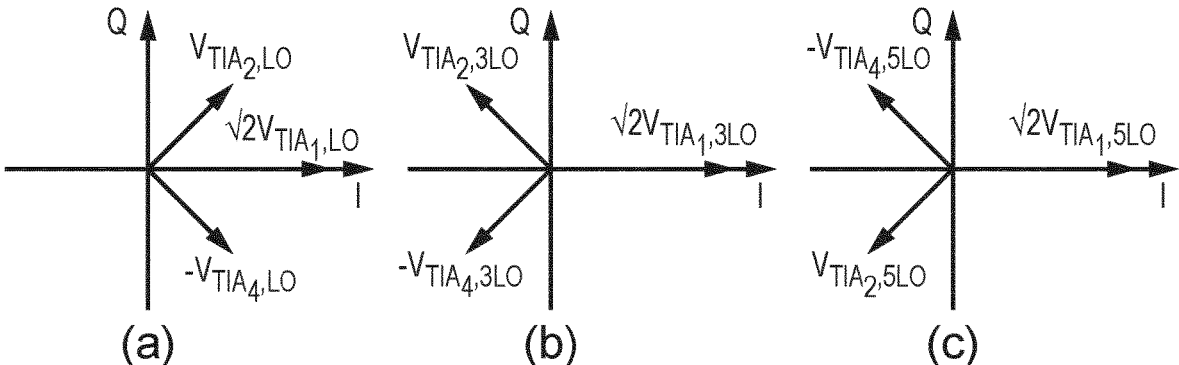

In the following, the operation principle of the 8-phase receiver and the rejection of the down converted blocking signals from $3f_{LO}$ and $5f_{LO}$ is described at the I-channel but the operation at the Q-channel is similar. The way in which 8-phase receivers reject the third and fifth LO harmonics is shown in FIG. 4B. More specifically, FIG. 4B shows how harmonic blocking signals are rejected at the I-channel. A similar process occurs at the Q-channel.

The in-channel (i.e. at the pass-band of the low-pass filters) voltage at the I-channel output is, e.g. equivalent to the voltage at (OUT$_I$) of the uppermost output TIA 68 from FIG. 4A, can be expressed as:

$$V_{OUT,I} = \frac{R_{BB}}{R_{BB_1}} \left( \sqrt{2} V_{TIA_1} + V_{TIA_2} - V_{TIA_4} \right).$$

That is, the voltage $V_{TIA1}$ is scaled by $\sqrt{2}$ and summed with $V_{TIA2}$ and inverted $V_{TIA4}$. The harmonic rejection can be illustrated by plotting the phasor representation of ($\sqrt{2}V_{TIA_1} + V_{TIA_2} - V_{TIA_4}$) for the down converted desired and blocking signals from $3f_{LO}$ and $5f_{LO}$ (FIG. 4B).

FIG. 4B shows in phasor representation the term ($\sqrt{2}V_{TIA_1} + V_{TIA_2} - V_{TIA_4}$) for the following down-converted signals: (a) the desired signal, (b) the blocking signal from $3f_{LO}$, and (c) the blocking signal from $5f_{LO}$. The following explains how the desired signal is present at the output while the blocking signals are cancelled by an 8-phase receiver architecture.

As seen from FIG. 4B (b), the components of $V_{TIA_2,3LO}$ and $-V_{TIA_4,3LO}$ cancel each other out in Q-direction since their magnitudes are equal ($V_{BB,3LO}$) but their phase angles are 135° and -135°, respectively. Accordingly, their resultant is $$2V_{BB,3LO} \cos\frac{\pi}{4} \angle 180° = \sqrt{2} V_{BB,3LO} \angle 180°.$$

However, this in opposite direction than $\sqrt{2}V_{TIA_1,3LO} = \sqrt{2}V_{BB,3LO}\angle 0°$ but equal in magnitude. As a result, the down converted blocking signal from $3f_{LO}$ is cancelled at the I-channel output.

Similarly, as seen from FIG. 4B (c), the components of $V_{TIA_2,5LO}$ and $-V_{TIA_4,5LO}$ cancel each other out in Q-direction since their magnitudes are equal ($V_{BB,5LO}$) but their phase angles are 225° (-135°) and 135°, respectively. Accordingly, their resultant is $$2V_{BB,5LO} \cos\frac{\pi}{4} \angle 180° = \sqrt{2} V_{BB,5LO} \angle 180°.$$

Again, this in opposite direction than $\sqrt{2}V_{TIA_1,5LO} = \sqrt{2}V_{BB,5LO}\angle 0°$ but equal in magnitude. Thus, also the down converted blocking signal from 5fLO is cancelled at the I-channel output.

Finally, as seen from FIG. 4B (a), the components of $V_{TIA_2,LO}$ and $-V_{TIA_4,LO}$ cancel each other out in Q-direction since their magnitudes are equal ($V_{BB,LO}$) but their phase angles are 45° and -45°, respectively. Accordingly, their resultant is $$2V_{BB,LO} \cos\frac{\pi}{4} \angle 0° = \sqrt{2} V_{BB,LO} \angle 0°.$$

Since this is in the same direction than $\sqrt{2}V_{TIA_1,LO} = \sqrt{2}V_{BB,LO}\angle 0°$ with equal magnitude, the total resultant of the desired signal is $2\sqrt{2}V_{BB,LO}\angle 0°$.

The result is that the down-converted blocking signals shown in FIG. 4B (b) and (c) are cancelled at the I-channel output, and the down-converted desired signal, shown in FIG. 4B (a) is present at the I-channel output.

Equally the same principle applies at the Q channel output (OUT$_Q$ 70).

It is emphasized that although the down converted blocking signals from $3f_{LO}$ and $5f_{LO}$ are cancelled at the receiver output, they do appear at the outputs of the individual TIAs $TIA_1$-$TIA_4$.

At the I-channel (and Q-channel) output e.g. equivalent to the output (OUT$_I$) of TIAs 68 from FIG. 4A, the magnitude of the desired signal is $$V_{OUT,I} = \frac{R_{BB}}{R_{BB1}} 2\sqrt{2} V_{BB,LO} = G_m \frac{2}{\pi} \sin\frac{\pi}{8} R_{TIA} 2\sqrt{2} \frac{R_{BB}}{R_{BB1}} V_{IN,RF}$$

Accordingly, the voltage gain of an 8-phase receiver 72 is:

$$A_V = \frac{V_{OUT,I}}{V_{IN,RF}} = G_m \frac{2}{\pi} \sin\frac{\pi}{8} R_{TIA} 2\sqrt{2} \frac{R_{BB}}{R_{BB1}}$$

Multiband RF preselection filter-less receivers need to be sufficiently linear to tolerate out-of-band blocking signals and they need to be able to reject blocking signals at LO harmonics. If the blocking signals at LO harmonics of $7f_{LO}$ or above are no concern, an 8-phase harmonic rejection topology is the obvious architecture for multiband RF preselection filter-less receiver instead of 4-phase receiver. Unfortunately, the generation of 8-phase LO signals needed by the 8-phase receiver introduces its own challenges especially at high frequencies.

The following explains why an 8-phase receiver is best suited to low/moderate operation frequencies or frequency bands while a 4-phase receiver is also suited to higher operation frequencies or frequency bands.

A common way to generate 8-phase LO signals is to employ a frequency divider-by-8 or divider-by-4. This requires the frequency of the LO signal ($f_{SX}$) generated by the RF transceiver synthesizer (SX) or voltage-controlled oscillator (VCO) to be 8× or 4× higher than the frequency of the final LO signal ($f_{LO}$) driving the mixer. For comparison, the 4-phase LO signals can be generated by a frequency divider-by-2, therefore, the synthesizer or VCO can be run at $2f_{LO}$. Therefore, the use of an 8-phase receiver typically requires a synthesizer or VCO running at 2× or 4× the frequency needed by the typical 4-phase receiver. Unfortunately, a higher operation frequency translates to undesirably higher power consumption in LO circuits, whose waveforms resemble rail-to-rail digital signals.

In some cases, the higher power consumption in the LO circuits may not be tolerable, and/or the task of designing the synthesizer and the VCO to withstand frequencies of $f_{SX}=4f_{LO}$ or $f_{SX}=8f_{LO}$ may become too challenging to be practical. In practice, this is usually the case at the higher reception frequency bands, which need high LO and VCO frequency.

As will be appreciated, there are shortcomings with all of these known approaches. However, as is described in more detail below, in accordance with the present invention a multiband receiver is provided which can tune to a wide range of frequencies. Some bands may correspond to a low or moderate LO frequency and other bands may correspond to a higher LO frequency. The specific low, moderate, and high LO frequency terms herein depend on various factors, e.g. the integrated circuit technology, receiver requirements, and intended applications. The configurable RF receiver described below is advantageous as it can switch from one mode suited for a particular frequency range, to another mode suited to another frequency range, thus, increasing the number of possible reception frequencies, whilst minimising power consumption and component count.

The embodiment described below comprises circuitry for operating two modes: 4-phase mode and 8-phase mode. A configurable RF receiver that can operate in 8-phase mode for a first frequency range and 4-phase mode for a second frequency range allows the receiver to be used for a wider range of reception frequencies. As will be seen, the receiver can be configured to operate the desired mode based on a first configuration of a configurable resistor network. Instead of simply combining two independent receiver circuits on one chip in parallel, the architecture described herein allows components to be shared between modes which leads to lower design complexity, silicon area, cost, and a lower bill of materials (BOM).

Figure 5:
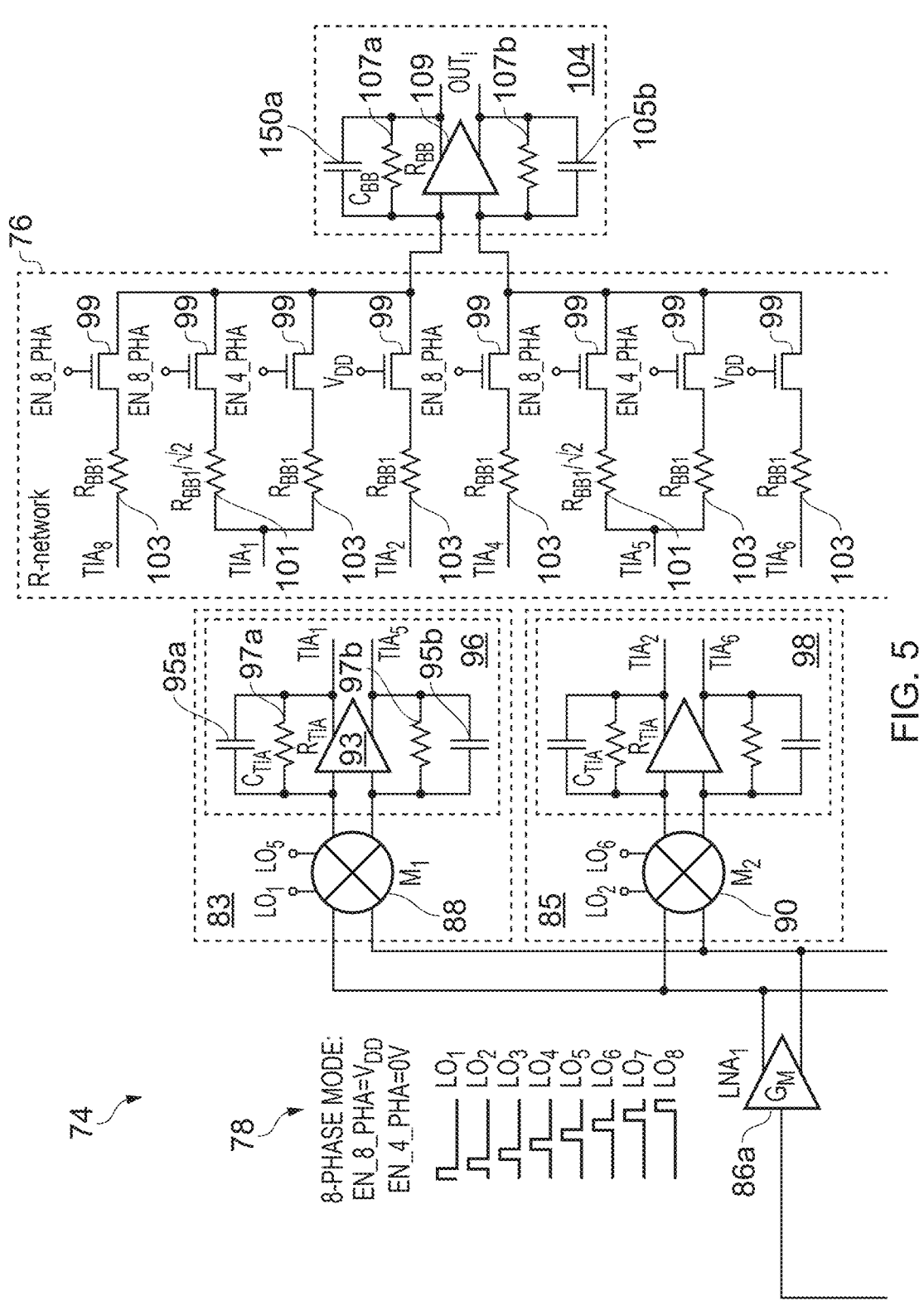
Figure 5:
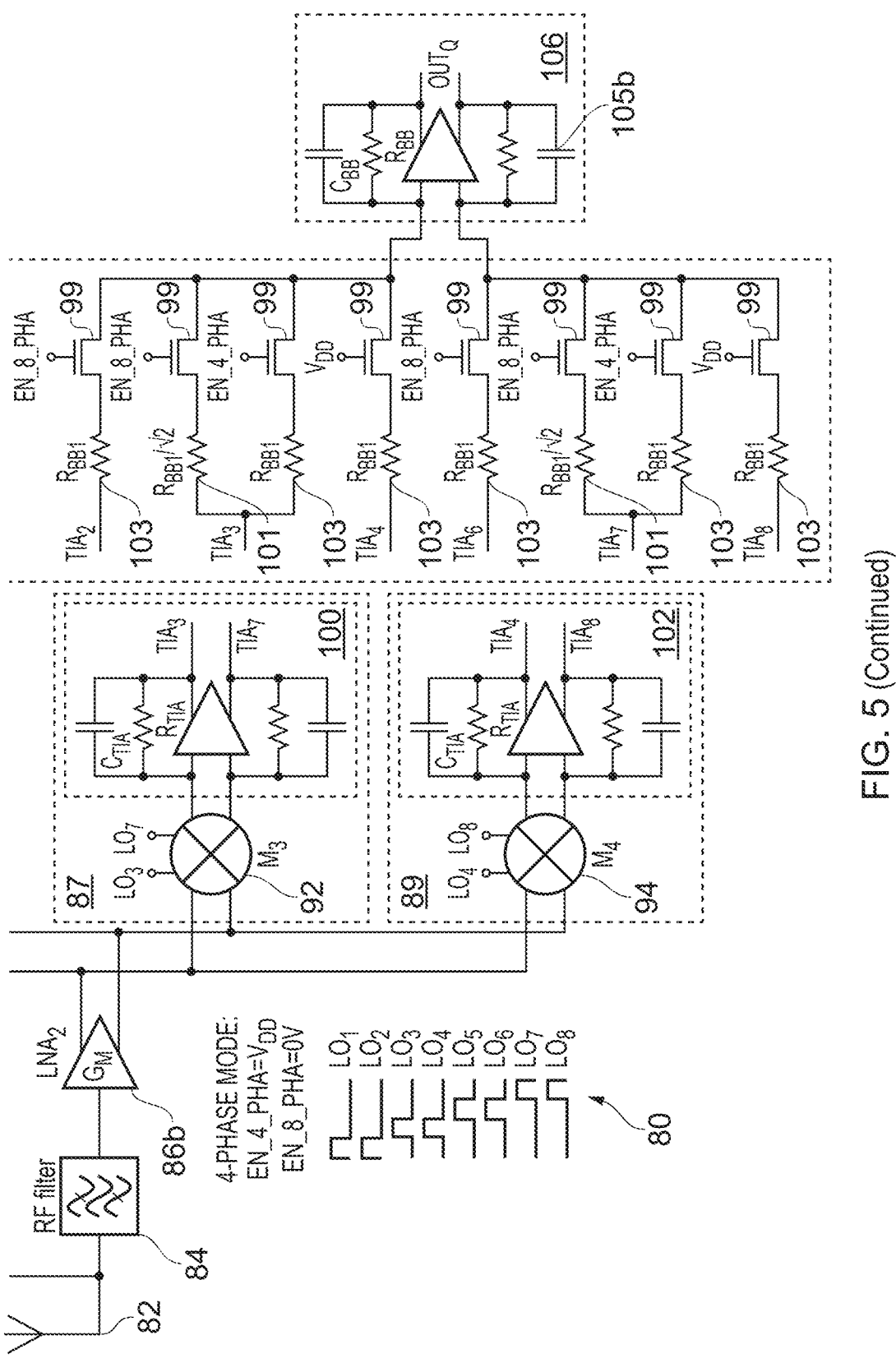

In the embodiment shown in FIG. 5 the configurable RF receiver can be configured to operate in a first mode (8-phase mode) or a second mode (4-phase mode), and is known as an 8/4-phase wireless receiver.

The configurable RF receiver comprises an antenna 82 which is directly connected to a first LNA ($LNA_1$ 86a) and directly connected to an RF filter 84 which is connected to a second LNA ($LNA_2$ 86b). Two LNAs 86a, 86b are used, but depending on the application and requirements, a single wideband or configurable LNA may suffice, or more than two LNAs can be used if needed. The LNAs 86a, 86b might be wideband or configurable to multiple bands, or they might be narrowband possibly preceded by the RF preselection filter 84 in the 4-phase mode. The LNAs 86a, 86b each have a single-ended input and differential output. However, this is not a necessity of the invention. For example, LNAs with differential inputs can be used. Also, LNAs with single-ended inputs and outputs can be employed, but this requires the use of single-balanced mixers, i.e. mixers with single-ended RF input, balanced LO input, and balanced BB output.

In the configurable receiver of FIG. 5, there are four mixer modules 83, 85, 87, 89 each comprising a mixer 88, 90, 92, 94 and a TIA 96, 98, 100, 102. Each of the four mixers 88, 90, 92, 94 are current-mode passive mixers with a differential input, differential LO input, and differential output. The input of each mixer receives an RF current from one of the two LNAs. The mixers 88, 90, 92, 94 convert the RF current to a baseband current, and the TIAs 88, 90, 92, 94 convert the baseband current to a baseband voltage.

Eight LO signals ($LO_1$-$LO_8$) generated by an oscillator arrangement (not shown) drive the four mixers 88, 90, 92, 94 ($M_1$-$M_4$). There are eight outputs from the four TIAs 96, 98, 100, 102, of the mixer modules 83, 85, 87, 89 and each output is labelled $TIA_1$-$TIA_8$. The TIAs 96, 98, 100, 102 of the mixer modules 83, 85, 87, 89, as exemplified by the uppermost mixer module 83, each comprise a differential amplifier 93, e.g. an op-amp, with a feedback network for each of the TIA's outputs, i.e. for the inverting and non-inverting outputs of the TIA. Each feedback network comprises a respective TIA feedback resistor ($R_{TIA}$) 97a and TIA feedback capacitor ($C_{TIA}$) 95a between the inverting input and the non-inverting output, and a corresponding feedback resistor 97b and capacitor 95b between the non-inverting input and the inverting output. The TIAs 96, 98, 100, 102 are current-to-voltage-converters and also act as low-pass filters.

The configurable resistor network (R-network) 76 converts the output voltages ($TIA_1$-$TIA_8$) of the TIAs 96, 98, 100, 102 to baseband currents, which are weighted and summed at the inputs of two 'output' low-pass filters, which are embodied as two 'output' TIAs 104, 106, which provide the I and Q output voltages. The R-network 76 comprises a plurality of resistors 101,103 with weighted resistance values (with a resistance of $R_{BB1}$ for some resistors 103 or $R_{BB1}/\sqrt{2}$ for the other resistors 101).

The R-network 76 also comprises a plurality of NMOS switch transistors 99 (herein referred to as the 'switches'), each preceded by one of the resistors. Each switch 99 connects each respective resistor 101,103 to an input of one of the two output TIAs 104, 106. A portion of the plurality of switches 99 have their gates connected to the control signal EN_4_PHA. These switches are enabled (closed) in the 4-phase mode. Another portion of the plurality of switches 99 have their gates connected to EN_8_PHA. These switches are closed in the 8-phase mode. The remainder of the plurality of switches 99 have their gates connected to the supply voltage ($V_{DD}$) and so are closed in both modes. The switches 99 are therefore configured such that in the 8-phase mode, for example, the $TIA_8$, $TIA_1$, and $TIA_2$ outputs are connected to one of the inputs of the output TIA 104 via resistors $R_{BB1}$ 103, $R_{BB1}/\sqrt{2}$ 101, and $R_{BB1}$ 103, respectively. This weighting of resistors 101,103 in the 8-phase mode is similar to that shown in FIG. 4A.

In the 4-phase mode, the switches 99 are configured so that only the $R_{BB1}$ 103 resistors are connected to the inputs of the output TIAs 104,106.

The configurations of each mode are described in more detail below with reference to FIGS. 9 and 10.

The first and second output TIAs 104, 106 provide the in phase and quadrature (I/Q) output voltages. The output TIAs 104, 106 have a similar architecture to the four TIAs 96, 98, 100, 102 of the mixer modules 83, 85, 87, 89, comprising in the exemplary upper output TIA 104, a differential amplifier 109, e.g. an op-amp, and a feedback network comprising two feedback capacitors 105a, 105b one of which is labelled $C_{BB}$ and two feedback resistors 107a, 107b one of which is labelled $R_{BB}$.

FIG. 5 is merely illustrative and the realization of the 8/4-phase configurable receiver may be more complex than shown. For example, the configurable R-network 76 needs to be terminated with the virtual grounds provided by the TIAs (104 and 106 in FIG. 5) to realize current summing, but the TIA 104, 106 stages may be replaced by higher-order low-pass filters but with the virtual grounds at the outputs of the configurable R-network 76 in order to allow current summing. Further, the ADCs have been omitted from FIG. 5 for simplicity.

Figure 6:
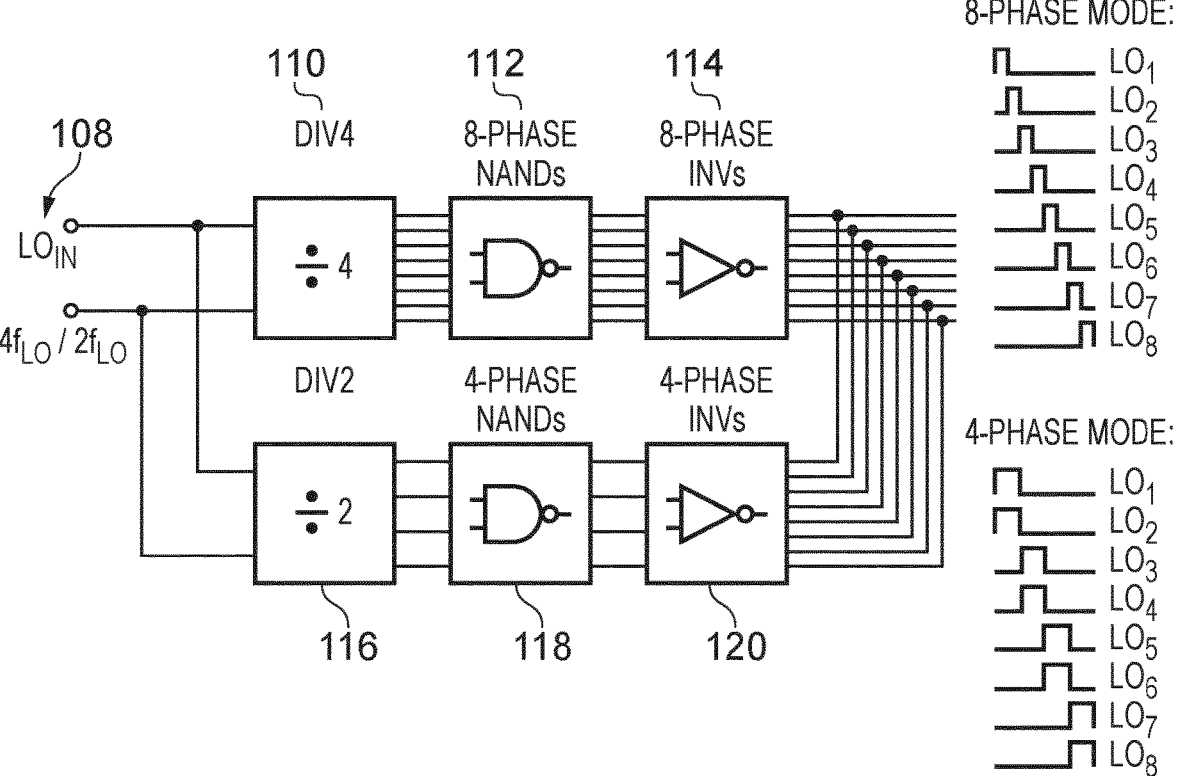
FIG. 6 shows how the LO signals are generated for the configurable 8/4-phase receiver embodying the invention.

FIG. 6 schematically shows an example of part of an oscillator arrangement with the oscillator itself not being shown, i.e. an LO chain architecture, illustrating how the plurality of local oscillator (LO) signals are generated for both 4-phase and 8-phase mode in the configurable 8/4-phase receiver of FIG. 5. The LO chain architecture comprises two signal paths for each mode where the LO input (from the VCO or synthesiser) is fed to a frequency divider (divider-by-2 116 or divider-by-4 110), followed by NANDs 112, 118 and enable-inverters 114, 120. The enable-inverters 114, 120 are inverters which can be switched on or off. At lower frequencies, i.e. below a threshold frequency, the 8-phase mode uses a frequency divider-by-4 110 and at higher frequencies, i.e. above a threshold frequency, the 4-phase mode uses a frequency divider-by-2 116.

In the 8-phase mode, the frequency of the incoming LO signal 108 is divided by four at DIV4 110. In this case, the receiver LO chain provides eight non-overlapping rail-to-rail signals at its output with 45° steps and ⅛ duty cycle. Notably, in the 8-phase mode, each of the eight LO signals ($LO_1$, $LO_2$ . . . , $LO_8$) have distinct phase.

Figure 7A:
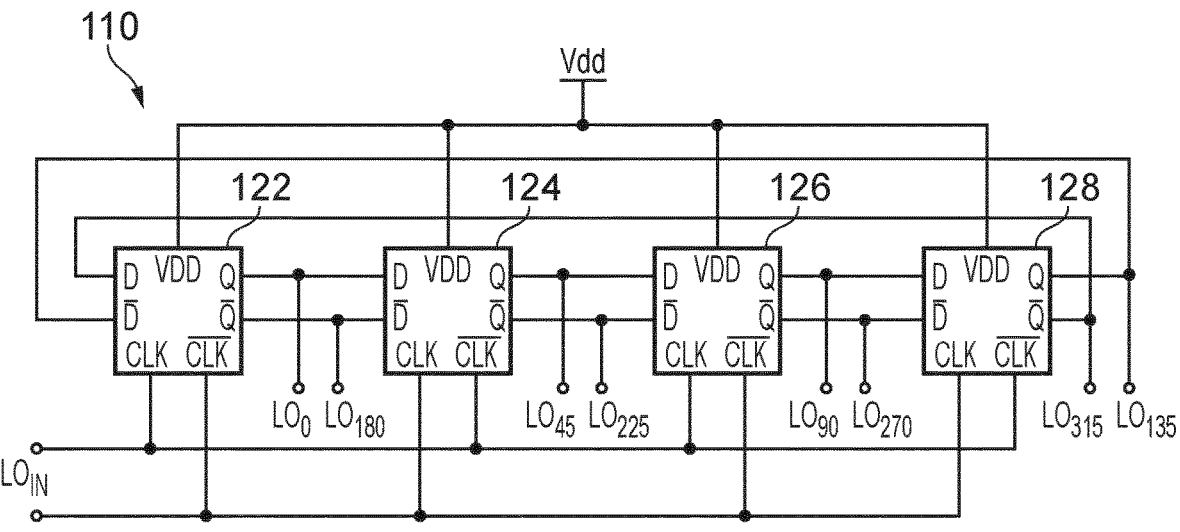
FIG. 7A shows in more detail the divider-by-4 of FIG. 6.
Figure 7A:
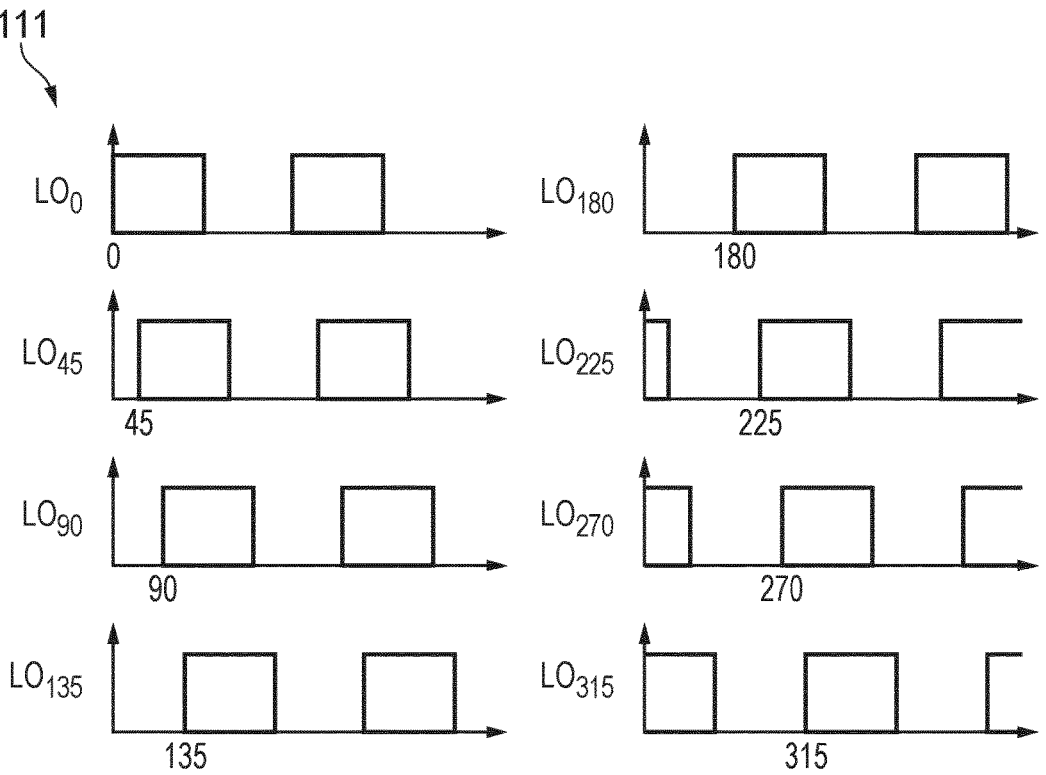
Figure 7B:
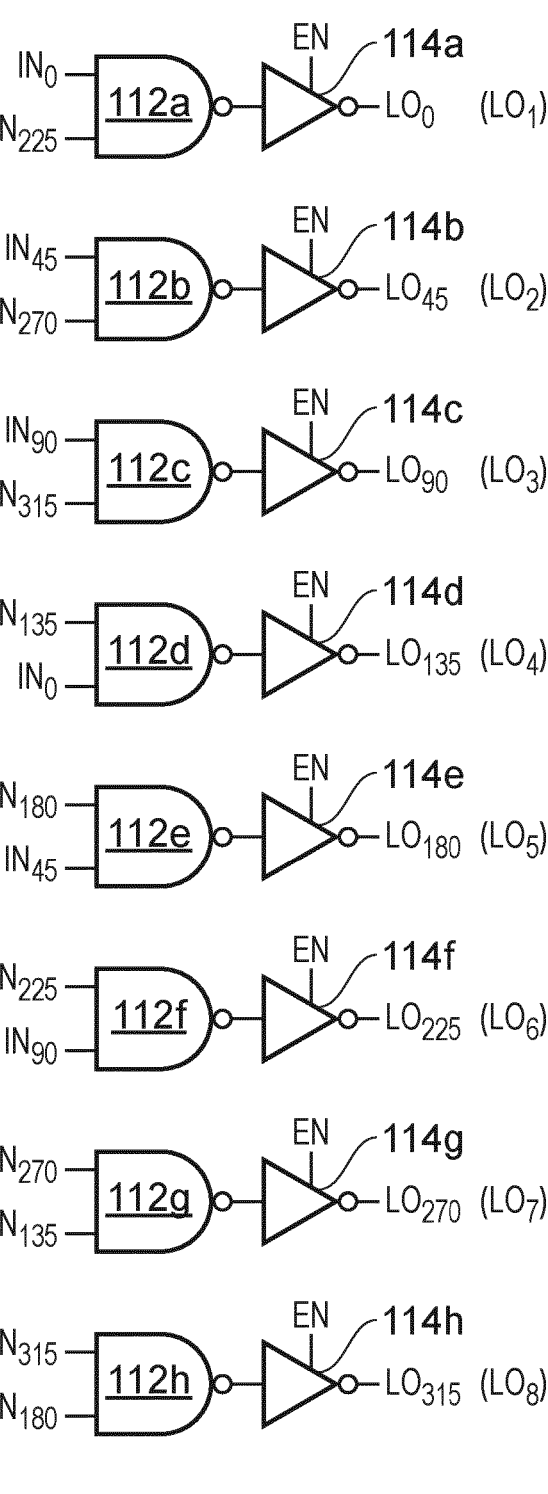
FIG. 7B shows in more detail the 8-Phase NANDs and 8-Phase inverters of FIG. 6.
Figure 7C:
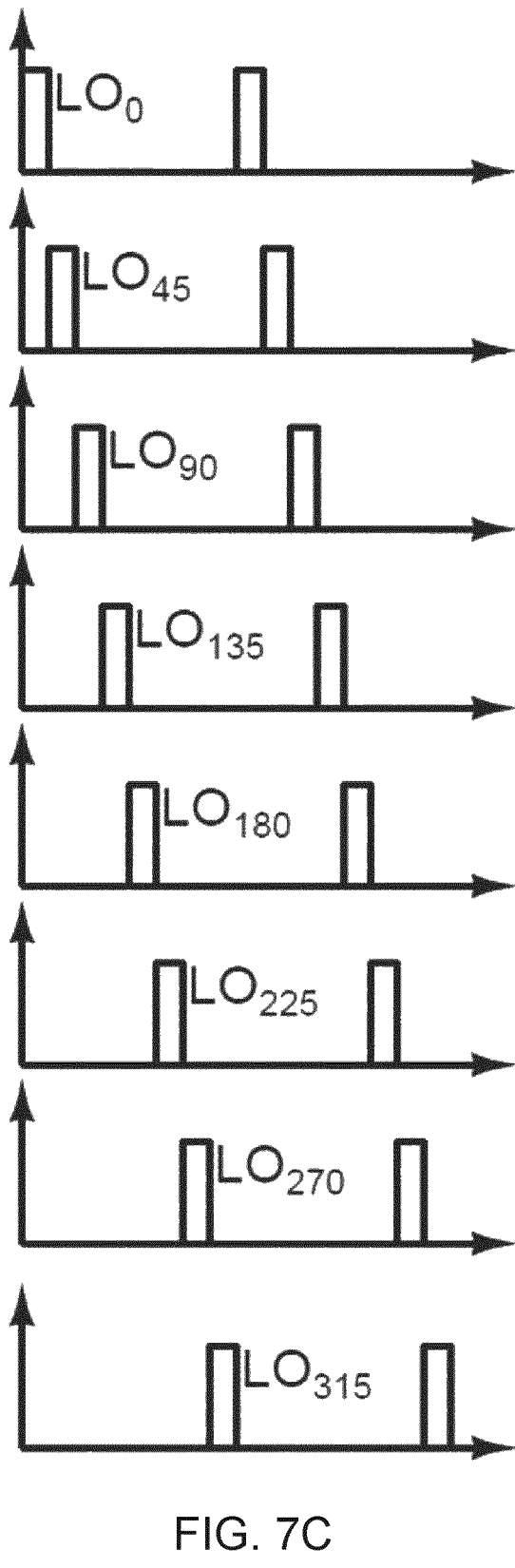
FIG. 7C shows the non-overlapping 8-phase LO signals with 12.5% duty cycle.

As shown in FIG. 7A, the frequency divider-by-4 (DIV4) 110 can be implemented with four flip-flops 122, 124, 126, 128 clocked at $4f_{LO}$ in the feedback loop. The divider-by-4 110 provides eight rail-to-rail LO signals 111 ($LO_0$, $LO_{45}$, $LO_{90}$, $LO_{135}$, $LO_{180}$, $LO_{225}$, $LO_{270}$, $LO_{315}$) at $f_{LO}$ shifted by 45° but with 50% duty cycle as shown in FIG. 7A. The harmonic rejection down-conversion mixer requires LO signals with duty cycle of ⅛ (12.5%). By combining the divider-by-4 110 output signals with NANDs 112a-h followed by enable-inverters 114a-h, as shown in FIG. 7B, the final desired LO duty cycle of 12.5% is achieved. FIG. 7C shows the desired LO signals which are output from the 8-phase signal path of the LO chain architecture of FIG. 6 with a 12.5% duty cycle.

FIG. 7B shows in more detail the NANDs 112a-h and enable-inverters 114a-h of the 8-phase mode signal path in the LO chain architecture. The NAND and enable-inverters result in the total logical function AND. It can be seen that each NAND 112a-h output is connected to a respective enable-inverter 114a-h input. In FIG. 7B, the LO signal labels ($LO_{1-8}$) are given alongside their corresponding phases ($LO_{0-315}$), e.g. in the 8-phase mode, $LO_1$ corresponds to $LO_0$, and $LO_2$ corresponds to $LO_{45}$ etc. The overall AND operation ensures that each output signal is only high when both inputs are high—i.e. when the 50% duty cycle of pairs of the phase-shifted signals overlap. By choosing appropriate pairs of such input signals, the required 12.5% duty cycle as shown in FIG. 6 and FIG. 7C is achieved. The eight output LO signals are then input to the four mixers 88, 90, 92, 94 (see FIG. 5).

The enable-inverters, e.g. 114a-h, are used to establish a high-impedance state at the inverter output, for inverters in the 8-phase oscillator signal path, while the 4-phase mode is enabled, and 8-phase mode is disabled or vice versa. In this embodiment, both the 8- and 4-phase enable-inverter outputs are connected together.

Figure 8A:
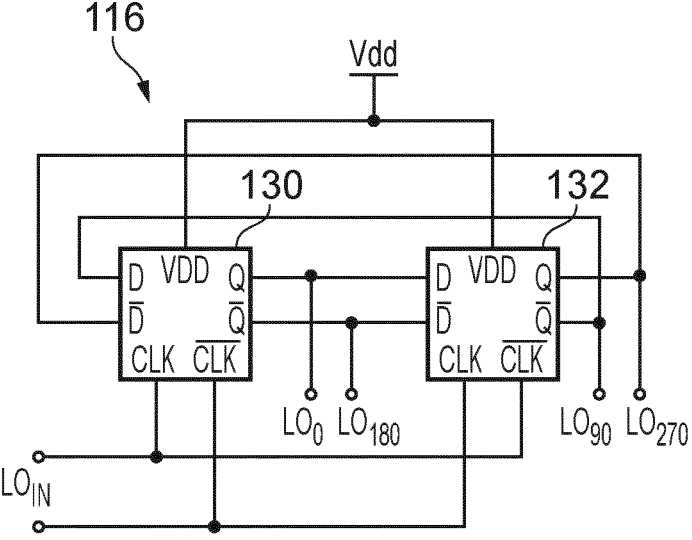
FIG. 8A shows in more detail the divider-by-2 of FIG. 6.
Figure 8A:
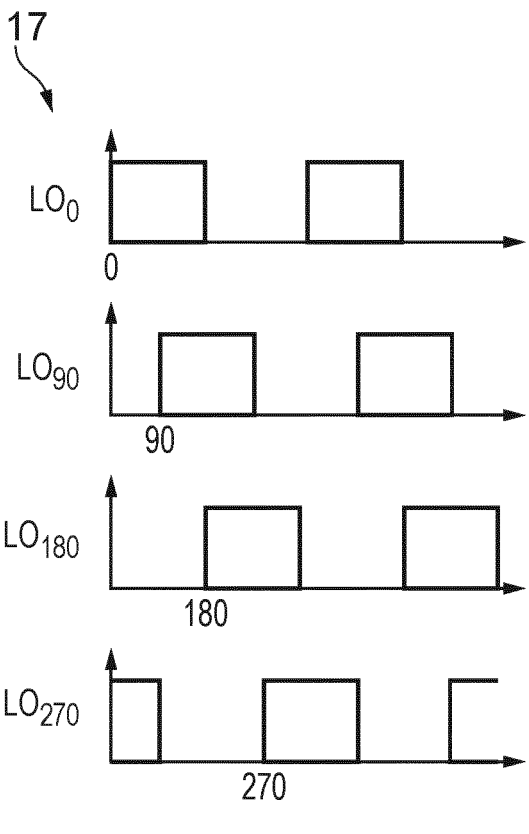

Turning back to FIG. 6, in the 4-phase mode, the frequency of the incoming LO signal is divided by two by the divider-by-2 circuit (DIV2) 116. The DIV2 116 is shown in more detail in FIG. 8A, and is implemented with two flip-flops clocked at $2f_{LO}$ in a feedback loop. The divider-by-2 116 provides four rail-to-rail LO signals 117 at $f_{LO}$ shifted by 90° with 50% duty cycle.

In the 4-phase mode, the down-conversion mixer requires LO signals with duty cycle of ¼ (25%). By combining the 50% duty cycle DIV2 output signals 117 with 4-phase NANDs 118a-d and 4-phase enable-inverters 120a-h, eight LO signals are output with the final desired LO duty cycle of 25%. The overall logical function AND results in a 'high' output (e.g. $V_{DD}$) when the two input square wave signals, e.g. $IN_{90}$ and $IN_0$, are simultaneously 'high', and a 'low' output (e.g. 0V), for when both signals are simultaneously 'low' or when one of the two input signals are 'low'. In other words, a high output only results if all the inputs to the gate are high, and if any input is low, a low output results. The resulting signals are fed to the LO inputs of the mixers 88, 90, 92, 94 (see FIG. 5). FIG. 8C shows the desired LO signals which are output from the 4-phase signal path of the LO chain architecture of FIG. 6 with a 25% duty cycle.

Figure 8B:
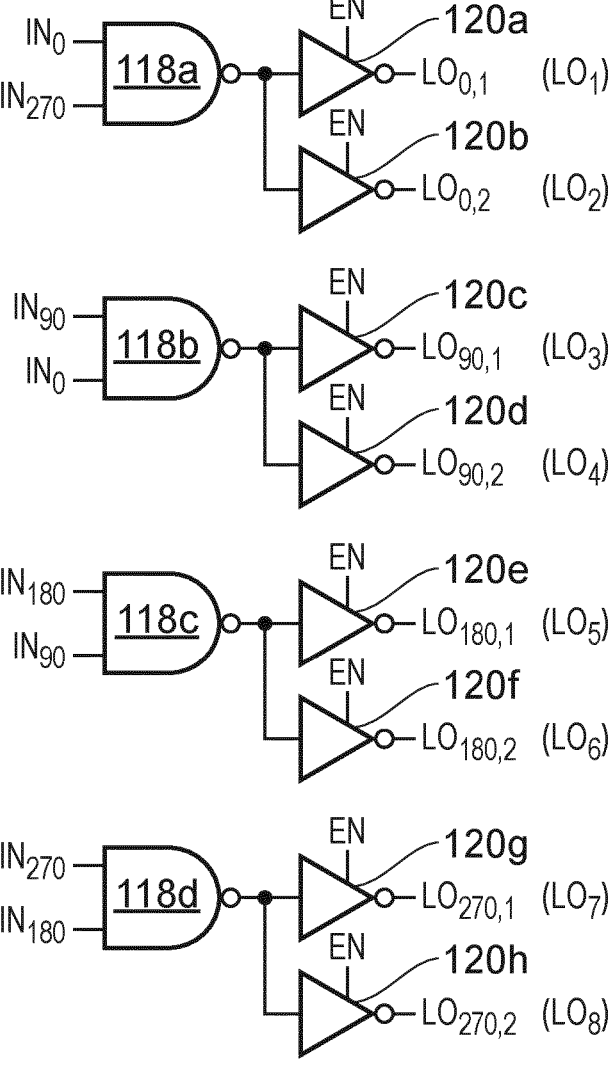
FIG. 8B shows in more detail the 4-Phase NANDs and 4-Phase inverters of FIG. 6.
Figure 8C:
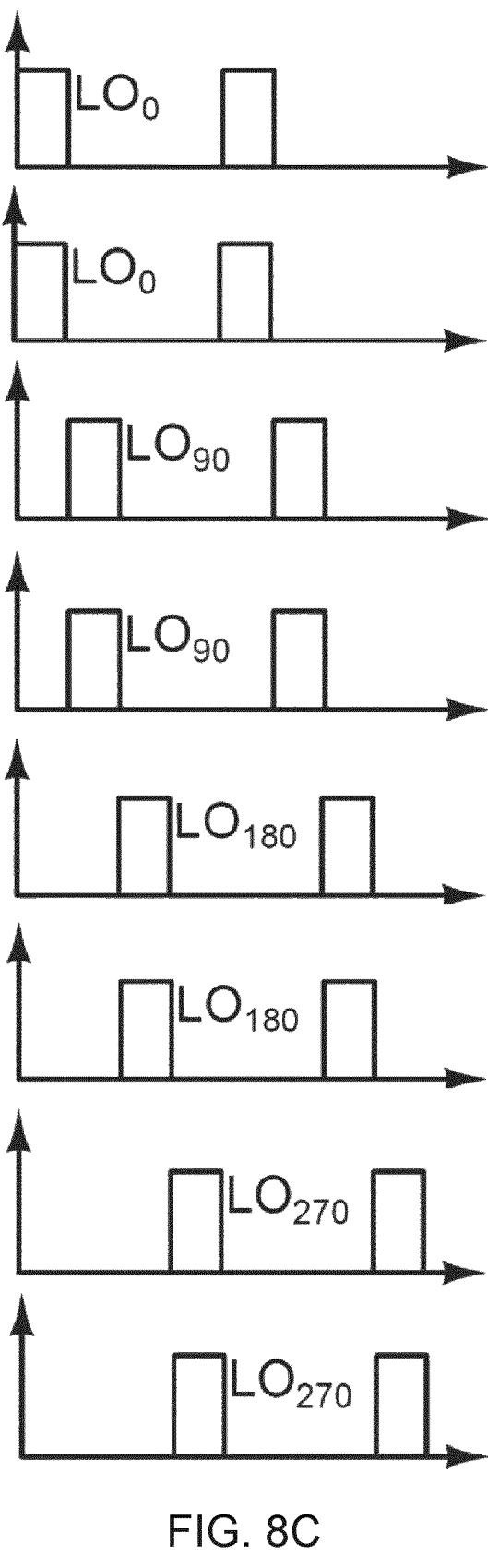
FIG. 8C shows the non-overlapping 4-phase LO signals with 25% duty cycle.

In FIG. 8B, the NANDs 118a-d and enable-inverters 120a-h for the 4-phase mode signal path are illustrated in more detail. It can be seen that the output of each NAND 118a-d is connected to two inverters 120a-h, which output two LO signals with equal phases. For example, the NAND 118a is connected to a first enable-inverter 120a and a second enable-inverter 120b. The two LO signals ($LO_{0,1}$ & $LO_{0,2}$) output from the two enable-inverters have the same phase. Therefore, in total eight LO signals can be output from the 4-phase signal path with four distinct phases. Eight separate LO signals are required to drive the four mixers of FIG. 5. This architecture, therefore, avoids any connection problems caused by switching between the two modes (i.e. both modes use eight signal lines).

In FIG. 8B, the LO signal labels are illustrated with the corresponding phases. For example. In the 4-phase mode, both $LO_1$ and $LO_2$ correspond to 0° and thus they are labelled as $LO_{0,1}$ and $LO_{0,2}$, respectively, while both $LO_3$ and $LO_4$ correspond to 90° and they are labelled as $LO_{90,1}$ and $LO_{90,2}$, respectively, etc.

The operation of the configurable RF receiver in 8-phase mode and 4-phase mode will now be described with reference to FIG. 5, FIG. 9 and FIG. 10.

In the proposed configurable 8/4-phase multiband receiver, the 8-phase mode is employed at low and moderate frequency bands, at which the required 8-phase LO signals can be generated conveniently usually by frequency dividerby-4, while at higher bands, the 4-phase mode is used with frequency divider-by-2. It is also of course possible to employ the 4-phase mode at some lower frequency bands, if desired for some reason.

Wireless RF signals are received at the antenna 82 which is directly connected to the first LNA (LNA$_1$ 86a) and directly connected to an RF filter 84 followed by the second LNA (LNA$_2$ 86b). The first LNA 86a will be active if the 8-phase mode is selected and the second LNA 86b will be active if the 4-phase mode is selected. In such a configurable 8/4-phase multiband receiver, the 8-phase mode is used at low or moderate frequency bands at which the 8-phase LO signals can be generated for example with acceptable LO power consumption. The 8-phase path may be implemented as an RF preselection filter-less receiver. At high frequency bands at which the generation of 8-phase LO signals becomes too challenging, the configurable receiver may use the 4-phase mode. In general, such frequency bands in 4-phase mode require an RF filter for filtering the blocking signals at LO harmonics.

The mode selection may come from control software (not pictured). In the control software, there are predefined receiver control settings for each frequency band to be supported. In practice, for example, if the receiver needs to tune to certain (low or moderate) frequency band and this frequency band is below certain threshold frequency, then the control software sets the receiver in the 8-phase mode. Similarly, if the receiver needs to tune to certain (high) frequency band and this frequency band is above certain threshold frequency, then the control software sets the receiver in the 4-phase mode. For example, a multiband LTE IoT receiver might need to support reception at frequency bands between 600-2700 MHz. Therefore, it may be practical to employ the 8-phase mode at frequency bands below 2.2 GHz and correspondingly the 4-phase mode at bands above 2.2 GHz. Moreover, if the 8-phase LO signals needed by the harmonic rejection mixer are generated by the frequency divider-by-4, the maximum RF synthesizer or VCO frequency would be 8.8 GHz. The 4-phase LO signals generated by the frequency divider-by-2 require at maximum the synthesizer to generate the frequency of 5.4 GHz. The 8-phase RF preselection filter-less multiband receiver path may use one or two wideband or configurable LNAs to cover 600-2200 MHz. On the other hand, since the frequency bands above 2200 MHz most likely utilize an RF filter, the corresponding LNA may be narrowband.

Different LO signals are generated depending on which mode is selected, e.g. the divider-by-4 is used for the 8-phase mode 78 to generate eight distinct phases (see FIG. 7C) and the divider-by-2 is used for the 4-phase mode 80 to generate four distinct phases (see FIG. 8C). The configurable R-network 76 is configured differently for each mode using the plurality of switches 99. FIG. 5 shows that in 8-phase mode 78 the control signal EN_4_PHA is low (0V) and EN_8_PHA is high (V$_{DD}$). Whereas in the 4-phase mode 80 the control signal EN_4_PHA is high (V$_{DD}$) and EN_8_PHA is low (0V).

Turning now to FIG. 9, the receiver embodying the invention is shown in 8-phase mode. In the 8-phase mode, the down conversion mixer operates as a harmonic rejection mixer and the eight non-overlapping LO signals driving the mixers have the duty cycle of ⅛ or 12.5%. The circuit is largely similar to what can be seen in FIG. 5. However, the LO signals driving the mixers 88, 90, 92, 94 are labelled to show their phases, e.g. LO$_0$ and LO$_{180}$ are input to the mixer labelled M1 88 and LO$_{45}$ and LO$_{225}$ are input to the mixer labelled M2 90. Notably, the i$^{th}$ local oscillator signal LO$_i$ has a phase of (i−1)45°.

Furthermore, the eight TIA outputs are also labelled with their phases TIA$_{0-315}$. As the LO signals have distinct phase in the 8-phase mode, all the eight TIA outputs TIA$_1$, TIA$_2$, . . . TIA$_8$ have dedicated phase but equal magnitude. That is, if the output signal of TIA$_1$ has the phase of 0°, the TIA$_2$ output signal has the phase 45°, and the TIA$_8$ output signal has the phase 315°. That is, the i$^{th}$ TIA output signal TIA$_i$ has a phase of (i−1)45°. In FIG. 9, the first LNA (LNA$_1$) 86a is active, and the second LNA (LNA$_2$) is in power down mode assuming that the receiver is sufficiently linear against out-of-band blocking signals and the RF preselection filter can be omitted. This means that the receiver operates as a preselection filter-less receiver and can be tuned to multiple frequency bands. The 8-phase mode is used at low or moderate frequency bands, at which the 8-phase LO signals can be generated without excessive penalty in LO power consumption etc.

The resistor network (R-network) 76 in FIG. 9 shows the lines that are active when 8-phase mode is selected. In the R-network 76, there are NMOS switch transistors in series with the plurality of resistors 101,103. These switches 99 can be seen in FIG. 5. In the 8-phase mode the switches 99 whose gates are connected to V$_{DD}$ or EN_8_PHA are enabled (conducting). In other words, when the configurable RF receiver is in 8-phase mode, the switches 99 labelled EN_8_PHA are closed and the switches 99 labelled EN_4_PHA are open, such that the circuit depicted in FIG. 5 effectively becomes the circuit of FIG. 9.

The switches 99 configure the R-network depending on the selected mode. For example, at the uppermost input of the uppermost output TIA 104, in the 8-phase mode, the TIA outputs from the mixer modules 83, 85, and 89 in FIG. 9, labelled TIA$_{315}$, TIA$_0$, and TIA$_{45}$ are connected to the output TIA 104 via resistors R$_{BB1}$, R$_{BB1}$/√2, and R$_{BB1}$ 103, 101, 103 respectively, because the switches that are in series with these resistors 103, 101, 103 are closed in 8-phase mode.

In FIG. 5, there are switches 99 connected to the supply voltage V$_{DD}$ which are conducting (closed) in both the 8-phase and 4-phase modes. These switches 99 are added to ensure that all total resistances track each other even in the IC process corners. The switches have a non-zero on-resistance, which adds up to the resistance of actual resistor in series with the switch changing the effective total resistance of the branch. Therefore, it is necessary to add the switches having the gate connected to V$_{DD}$ to make sure that the signals are summed with correct coefficients. All switches 99 shown in FIG. 5 are present but not shown in FIGS. 9 and 10.

The 8/4-phase receiver embodying the invention, shown in FIG. 9, in the 8-phase configuration corresponds to an 8-phase receiver 72, as shown in FIG. 4A. As a result, the receiver has the ability to reject blocking signals at 3f$_{LO}$ and 5f$_{LO}$. The receiver voltage gain of the desired signal from the LNA input to the I (or Q) output is repeated here for convenience:

$$A_{V,8-PHASE} = \frac{V_{OUT,I}}{V_{IN,RF}} = G_m \frac{2}{\pi} \sin\frac{\pi}{8} R_{TIA} 2\sqrt{2} \frac{R_{BB}}{R_{BB1}}$$

Turning to FIG. 10 the receiver embodying the invention is shown in the 4-phase mode. The configurable RF receiver

74 embodying the invention in FIG. 5, when operating in the 4-phase mode as shown in FIG. 10, operates as a 4-phase receiver 40.

In the 4-phase mode, the second LNA (LNA₂) 86b is active while the first LNA (LNA₁) 86a is in power down mode. In this example, an RF preselection filter 84 is used. As discussed, although the receiver 74 could be designed to be sufficiently linear against the out-of-band blocking signals, the RF preselection filter 84 is in general needed in the 4-phase mode to attenuate the blocking signals at the harmonics of the LO signal frequency. In the 4-phase configuration shown in FIG. 10, the receiver is tuned to a single frequency band. This is because RF filters are typically narrowband. The 4-phase mode is used at higher frequency bands, at which the generation of 8-phase LO signals is not possible or convenient.

In the 4-phase mode, the mixers are driven by LO signals having the duty cycle of ¼ or 25% (see FIG. 8C). As explained above with reference to FIGS. 6, 8A, 8B and 8C; there are eight LO output signals but four distinct phases entering the mixers (M₁ to M₄) 88, 90, 92, 94. For example, LO₁ and LO₂ from FIG. 5 have equal phase of 0° (in FIG. 10, LO₁ and LO₂ are labelled as LO₀,₁ and LO₀,₂). Equally, LO₃ and LO₄ from FIG. 5 have equal phase of 90° etc. (in FIG. 10, LO₃ and LO₄ are labelled as LO₉₀,₁ and LO₉₀,₂). The same applies to the remaining LO signals (LO₅ to LO₈).

It can be seen in FIG. 10 that the mixers M₁ 88 (M₃ 92) and M₂ 90 (M₄ 94) are driven by LO signals with equal phase. Thus, as the mixers M₁ 88 (M₃ 92) and M₂ 90 (M₄ 94) are driven by the LO signals of equal phase, the outputs of the corresponding TIAs, the first TIA 96 (the third TIA 100) and the second TIA 98 (the fourth TIA 102), have equal phase and magnitude.

Since the mixers M₁ and M₂ are driven by LO signals having equal phase and the corresponding TIA output voltages are in-phase with equal amplitude, the mixer M₁ 88 in series with the first TIA 96 appears in parallel with M₂ 90 in series with second TIA 98. Similarly, in the 4-phase mode, M₃ 92 in series with the third TIA 100 appears in parallel with M₄ 94 in series with the fourth TIA 102.

In FIG. 10, for simplicity, the switches whose gates are connected to V_DD or EN_4_PHA, when the configurable RF receiver is in 4-phase mode, are closed and for simplicity replaced by short circuits, such that the circuit depicted in FIG. 5 effectively becomes the circuit of FIG. 10.

As will be appreciated from the description above the receiver is configured in such a way that all four mixer modules 83, 85, 87, 89, and consequently all the mixers 88, 90, 92, 94 and TIAs 96, 98, 100, 102, are used both in 4-phase mode and 8-phase mode.

Although the proposed configurable 8/4-phase receiver is more complex than a conventional 8-phase RF preselection filter-less receiver and it needs more than one receiver or LNA inputs, the configurable receiver 74 of FIG. 5 can allow more freedom with regard to the possible applications, the RF synthesizer design, and the optimisation of power consumption in the LO circuits. For example, if employing an RF pre-selection filter at particular frequency bands is desirable, the proposed architecture makes it possible.

Since the blocking signals up to 7f_LO are rejected in the 8-phase harmonic rejection mixer, it may be possible to omit the RF pre-selection filter in the 8-phase mode in the proposed configurable 8/4-receiver, assuming that the receiver can be designed to be sufficiently linear to tolerate blocking signals without pre-filtering. That is, blocking signals in general and also at other frequencies, not just at LO harmonics. Thus, as shown in FIG. 5, the proposed receiver operates as multiband RF preselection filter-less receiver in the 8-phase mode. However, since there is no rejection for the odd-order LO harmonics with the 4-phase mixer, the RF pre-selection filter is in general usually needed to attenuate the blocking signals at LO harmonics in the 4-phase mode, even though the receiver itself would be linear enough.

In the exemplary configurable 8/4-phase receiver as shown in FIG. 5, two LNAs are employed.

In FIG. 5, the outputs of LNA₁ 86a and LNA₂ 86b are connected together. In this way, if the LNAs 86a, 86b employ an LC tuned resonator at their load, connecting the LNA outputs together allows both LNAs to share a common resonator. This further reduces the silicon area required for the configurable RF receiver 74.

The first LNA (LNA₁ 86a), which is used in the 8-phase mode, can be either wideband or configurable to multiple bands. In this example, the receiver 74 has been designed to be sufficiently linear not to require an RF pre-selection filter when in 8-phase mode. The harmful down-conversion of blocking signals is further reduced by the rejection of LO harmonic frequencies at 3f_LO and 5f_LO as previously described. Thus, the configurable receiver 74 operates as multiband RF preselection filter-less receiver in the 8-phase mode. For applications which require the 8-phase mode to support a very wide band of frequencies, the receiver 74 may comprise, for example, two LNAs in the 8-phase path.

The second LNA (LNA2, 86b) is preceded by the RF preselection filter and it is used in the 4-phase mode. This LNA 86b can be narrowband.

At high frequency bands at which the generation of 8-phase LO signals becomes too challenging, the configurable RF receiver embodying the invention may use the 4-phase mode. However, since there is no rejection for the odd-order LO harmonics with the 4-phase mixer, the RF pre-selection filter 84 is, in general, necessary to attenuate the blocking signals at LO harmonics in the 4-phase mode, even though the receiver itself would be sufficiently linear.

To summarize, in the 8-phase mode, the configurable 8/4-receiver of FIG. 5 operates as RF preselection filter-less multiband receiver whereas in the 4-phase mode, the receiver operates at single band with RF filter. However, in some scenarios, the blocking signals at LO harmonics may not be an issue, even in the 4-phase mode. Accordingly, in these cases the RF preselection filter 84 may be omitted. Such a scenario may arise, for example, when the receiver 74 is tuned to receive at a relatively high RF frequency and when the odd-order LO harmonics occur at such frequencies that there are practically no blockers.

Turning to FIG. 10, in the 4-phase mode, the desired down-converted signal voltage at the differential output of one of the first two TIAs, e.g. 96 (TIA₁) or 98 (TIA₂) is:

$$V_{TIA_1,LO} = V_{TIA_2,LO} = (G_m V_{IN,RF}) \cdot \frac{1}{2} \cdot \frac{\sqrt{2}}{\pi} R_{TIA} \angle 0°$$

Here, $(G_m V_{IN,RF})$ represents the RF current driven to the mixers. The factor of ½ is due to the driving the RF current at time to two mixers M₁ 88 and M₂ 90 (or equally to M₃ 92 and M₄ 94). Again, √2/π represents the conversion loss due to the mixing by the 25% duty cycle LO signal and R_TIA is the TIA feedback resistance. The subscript LO refers to the down-conversion from f_LO.

In the 4-phase mode, the desired I-channel output voltage is given as:

$$V_{OUT,I} =$$

$$\left(\frac{V_{TIA_1,LO}}{R_{BB1}} + \frac{V_{TIA_2,LO}}{R_{BB1}}\right)R_{BB} = 2\frac{V_{TIA_1,Lo}}{R_{BB1}}R_{BB} = G_m\frac{\sqrt{2}}{\pi}R_{TIA}\frac{R_{BB}}{R_{BB1}}V_{IN,RF}\angle 0°$$

from which the voltage conversion gain from the LNA input to the I-channel (or Q-channel) output is:

$$A_{V,4-PHA} = \frac{V_{OUT,I}}{V_{IN,RF}} = G_m\frac{\sqrt{2}}{\pi}R_{TIA}\frac{R_{BB}}{R_{BB1}}$$

Referring back to the previously derived voltage gain provided in the 8-phase mode:

$$A_{V,8-PHA} = \frac{V_{OUT,I}}{V_{IN,RF}} = G_m\frac{2}{\pi}\sin\frac{\pi}{8}R_{TIA}2\sqrt{2}\frac{R_{BB}}{R_{BB1}}$$

If the gain of the 8-phase mode and the 4-phase mode (see above) are compared, it can be seen that in the 8-phase mode, the receiver provides a higher voltage gain compared to the 4-phase mode. The 8-phase voltage gain is higher than the 4-phase voltage gain by a factor of:

$$\frac{A_{V,8-PHA}}{A_{V,4-PHA}} = 4\sin\frac{\pi}{8}(3.7\ dB)$$

Usually, this is not an issue. However, if desired, the voltage gains of the proposed 8/4-phase configurable receiver can be equalized by slightly modifying the R-network as shown in FIG. 11.

FIG. 11 shows a modified R-network 206 comprising resistors 203, 205, 207; switches 201 (having their gates connected to either EN_8_PHA or EN_4_PHA) and an output TIA 204 comprising a differential amplifier 195, e.g. an op-amp; and a feedback network comprising feedback resistors 199a, 199b, one of which is labelled $R_{BB}$, and feedback capacitors 197a, 197b, one of which is labelled CBB. Only the part of the R-network connected to the I-channel output is shown for simplicity.

The differences between the resistor network 76 of the first embodiment shown in FIG. 5, and the resistor network 206 of the embodiment shown in FIG. 11 are as follows. The resistor 103 ($R_{BB1}$) in the resistor network 76 of FIG. 5, that is connected to the TIA$_1$ output, has been replaced in the resistor network 206 of FIG. 11 with a resistor 205 ($R_{BB2}$) having a different resistance value. Similarly, the resistor 103 ($R_{BB1}$) of FIG. 5, which is connected to the TIAs output, has been replaced with another resistor 205 ($R_{BB2}$). The supply voltage control signal ($V_{DD}$) connected to the TIA$_2$ output in the resistor network 76 of FIG. 5, has been replaced with the control signal EN_8_PHA in FIG. 11. Similarly, the supply voltage control signal ($V_{DD}$) connected to the TIA$_6$ output in the resistor network 76 of FIG. 5, has been replaced with the control signal EN_8_PHA in FIG. 11. In the resistor network 206 of FIG. 11 each of the outputs of TIA$_2$ and TIA$_6$ is also connected to a resistor 205 ($R_{BB2}$) followed by a switch 201 with a control signal of EN_4_PHA which connects to the input of the I-channel output TIA 204.

With the modified R-network 206 shown in FIG. 11, the voltage gain in the 8-phase mode is the same as previously derived for a typical 8-phase receiver 72:

$$A_{V,8-PHA} = \frac{V_{OUT,I}}{V_{IN,RF}} = G_m\frac{2}{\pi}\sin\frac{\pi}{8}R_{TIA}2\sqrt{2}\frac{R_{BB}}{R_{BB1}},$$

However, the voltage gain in the 4-phase mode is modified as can be seen below:

$$A_{V,4-PHA} = \frac{V_{OUT,I}}{V_{IN,RF}} = G_m\frac{\sqrt{2}}{\pi}R_{TIA}\frac{R_{BB}}{R_{BB2}}$$

Thus, by selecting the below value for the resistors labelled $R_{BB2}$ 205, the voltage gains in the 8-phase and 4-phase modes can be designed to be equal:

$$R_{BB2} = \frac{R_{BB1}}{4\sin\frac{\pi}{8}}$$

The architecture shown in FIG. 11 allows the receiver voltage gains to be equalized in both 8- and 4-phase modes, which may be desirable so as to guarantee that the noise due to the ADCs is suppressed to equal levels in both modes.

Therefore, a configurable 8/4-phase receiver architecture can be achieved for multiband applications. In the receiver according to the invention, an 8-phase mode can be employed at low and moderate frequency bands, at which the 8-phase LO signals can be generated without excessive penalty in LO power consumption or the RF synthesizer performance. Since the 8-phase receiver is able to reject blocking signals at LO harmonics and assuming that the receiver can be designed to be sufficiently linear against the out-of-band blocking signals, the receiver may operate as RF preselection filter-less multiband receiver in the 8-phase mode. Accordingly, in the 8-phase mode, the receiver may utilize one or two wideband or configurable LNAs. At higher frequency bands at which the generation of 8-phase LO signals is impractical, the proposed receiver can operate in the 4-phase mode. In the 4-phase mode, in general an RF pre-selection filter is needed to attenuate blocking signals at LO harmonics.

As a summary, the proposed receiver architecture can be employed in multiband receivers, which is needed to support both multiband RF preselection filter-less operation and reception at single frequency band, possibly with RF pre-selection filter. As such, the presented architecture allows more freedom and flexibility for the RF receiver, VCO, and RF synthesizer design. The proposed receiver topology can be employed to realize effectively both 8-phase and 4-phase modes of operation by sharing the receiver circuits in both modes. This results in low silicon area, cost, and BOM.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A configurable radio frequency receiver having a first mode of operation and a second mode of operation and comprising:

at least one low noise amplifier;

an oscillator arrangement arranged to produce a plurality of signals having, in the first mode of operation, a first number of separate phases and, in the second mode of operation, a second number of separate phases, wherein the oscillator arrangement comprises a single oscillator and wherein the first number is different to the second number;

a plurality of mixer modules comprising inputs connected to an output of the low noise amplifier, wherein each mixer module comprises a respective mixer and transimpedance amplifier;

two or more output low-pass filters which accept current as their input; and a configurable resistor network comprising a plurality of resistors and switches, the configurable resistor network connecting the plurality of mixer modules to the two or more output low-pass filters, wherein the configurable radio frequency receiver is configured such that it can operate in the first mode with said plurality of signals having said first number of phases or the second mode with said plurality of signals having said second number of phases; and wherein the switches of the configurable resistor network are arranged to configure said resistor network to enable the configurable radio frequency receiver to operate in the first mode in a first configuration, and the second mode in a second configuration, and wherein said plurality of mixer modules are employed during the operation of the first mode and the second mode.

2. The configurable radio frequency receiver as claimed in claim 1, comprising a plurality of low noise amplifiers.

3. The configurable radio frequency receiver as claimed in claim 2, wherein at least one of the plurality of low noise amplifiers is preceded by a preselection filter.

4. The configurable radio frequency receiver as claimed in claim 2, wherein a first low noise amplifier of the plurality of low noise amplifiers is not preceded by a preselection filter and a second low noise amplifier of the plurality of low noise amplifiers is preceded by a preselection filter.

5. The configurable radio frequency receiver as claimed in claim 2, wherein at least one of the plurality of low noise amplifiers comprises a resonator, the resonator comprising an inductor-capacitor network.

6. The configurable radio frequency receiver as claimed in claim 2, wherein two or more of the plurality of low noise amplifiers are connected together at their respective outputs.

7. The configurable radio frequency receiver as claimed in claim 1, wherein the oscillator arrangement comprises a first frequency divider for generating the signals having the first number of phases, and a second frequency divider for generating the signals having the second number of phases.

8. The configurable radio frequency receiver as claimed in claim 1, wherein the number of separate phases in the first mode is eight and the number of separate phases in the second mode is four.

9. The configurable radio frequency receiver as claimed in claim 1, wherein the selection of a mode is determined by control software.

10. The configurable radio frequency receiver as claimed in claim 1, comprising only four mixer modules.

11. The configurable radio frequency receiver as claimed in claim 10, wherein said respective transimpedance amplifier of each mixer module comprises two differential outputs such that the four mixer modules have eight module outputs in total.

12. The configurable radio frequency receiver as claimed in claim 1, having only two output low-pass filters.

13. The configurable radio frequency receiver as claimed in claim 12, wherein the two output low-pass filters respectively output in-phase and quadrature signals.

14. The configurable radio frequency receiver as claimed in claim 1, wherein the output low-pass filters are transimpedance amplifiers.

15. The configurable radio frequency receiver as claimed in claim 1, wherein in the first mode a first set of switches are closed and in the second mode a second set of switches are closed and one or more of the switches are closed in both modes.

16. The configurable radio frequency receiver as claimed in claim 1, wherein the configurable resistor network is configured such that the voltage gain of the receiver operating in the first mode matches the voltage gain of the receiver operating in the second mode.

17. The configurable radio frequency receiver as claimed in claim 1, wherein the first mode is an 8-phase mode and the second mode is a 4-phase mode and the configurable resistor network is configured such that the voltage gain when the receiver is in the 4-phase mode matches the voltage gain when the receiver is in the 8-phase mode.

* * * * *